US011009388B2

(12) United States Patent
Coorey

(10) Patent No.: US 11,009,388 B2
(45) Date of Patent: May 18, 2021

(54) DETERMINING AND VISUALISING LIGHT AND VISIBILITY IN AN AREA BASED ON AT LEAST LOCAL INFORMATION OF THE AREA AND POSITIONS OF ONE OR MORE SOURCES OF LIGHT

(71) Applicant: The Institute of Digital Design Australia Pty Ltd, Sydney (AU)

(72) Inventor: Benjamin Paul Coorey, Sydney (AU)

(73) Assignee: The Institute of Digital Design Australia Pty Ltd, Sydney (AU)

( * ) Notice: Subject to any disclaimer, the term of this patent is extended or adjusted under 35 U.S.C. 154(b) by 172 days.

(21) Appl. No.: 16/331,108

(22) PCT Filed: Sep. 7, 2017

(86) PCT No.: PCT/AU2017/050968
§ 371 (c)(1),
(2) Date: Mar. 6, 2019

(87) PCT Pub. No.: WO2018/045421
PCT Pub. Date: Mar. 15, 2018

(65) Prior Publication Data
US 2019/0204145 A1    Jul. 4, 2019

(30) Foreign Application Priority Data

Sep. 7, 2016  (AU) ................................ 2016903595

(51) Int. Cl.
*G01J 1/42*       (2006.01)
*G06T 15/60*      (2006.01)
(Continued)

(52) U.S. Cl.
CPC ............ *G01J 1/4204* (2013.01); *G06F 30/13* (2020.01); *G06F 30/20* (2020.01); *G06T 15/506* (2013.01);
(Continued)

(58) Field of Classification Search
CPC ....................... G01J 1/4204; G01J 2001/4266
(Continued)

(56) References Cited

U.S. PATENT DOCUMENTS 10,574,876 B2 *   2/2020  Pincenti ................. G03B 15/03
2015/0302637 A1  10/2015  Glaser

OTHER PUBLICATIONS

International Search Report issued in corresponding International Patent Application No. PCT/AU2017/050968 dated Nov. 17, 2017.
(Continued)

*Primary Examiner* — Que Tan Le
(74) *Attorney, Agent, or Firm* — Morgan, Lewis & Bockius LLP

(57) ABSTRACT

This disclosure describes an improved method, system and software for determining light (310) and visibility in an area. This includes a method, system and software for determining a region of light (310) in a specified area (320) and to a method, system and software for determining a region of visibility in a specified area (320). This disclosure describes a method for determining and visualising a three dimensional region of light which has a defined non-zero volume through a process referred to as forward projection. The method comprises determining a three dimensional region of light (310) in a specified area such as an apartment (320) that receives light from one or more sources of light (350) based on determining location information (330) of the specified area (320); estimating one or more positions (340) of the respective one or more sources of light (350); and determining one or more light attenuating objects (360).

20 Claims, 31 Drawing Sheets

(51) Int. Cl.
  *G06T 15/50*     (2011.01)
  *G06F 30/13*     (2020.01)
  *G06F 30/20*     (2020.01)

(52) U.S. Cl.
  CPC ....... *G06T 15/60* (2013.01); *G01J 2001/4266* (2013.01); *G06T 2210/04* (2013.01)

(58) Field of Classification Search
  USPC .......................... 250/214 AL, 203.4, 214 R
  See application file for complete search history.

(56) References Cited

OTHER PUBLICATIONS

Roudsari et al., Aug. 2013. Ladybug: a parametric environmental plugin for grasshopper to help designers create an environmentally-conscious design. In Proceedings of the 13th international IBPSA conference held in Lyon France.

Jakubiec et al., Nov. 2011, DIVA 2.0: Integrating daylight and thermal simulations using Rhinoceros 3D, Daysim and EnergyPlus. In Proceedings of building simulation (vol. 20, No. 11, pp. 2202-2209).

Aelab.dk, Three dimensional daylight visualisation, published on Sep. 11, 2013 [retrieved from Internet on Nov. 15, 2017] <https://www.youtube.com/watch?v=-Fb0FBF9NdQ> (see ISR).

\* cited by examiner

DETERMINING AND VISUALISING LIGHT AND VISIBILITY IN AN AREA BASED ON AT LEAST LOCAL INFORMATION OF THE AREA AND POSITIONS OF ONE OR MORE SOURCES OF LIGHT

CROSS-REFERENCE TO RELATED APPLICATIONS

The present application claims priority from Australian Provisional Patent Application No 2016903595 filed on 7 Sep. 2016, the content of which is incorporated herein by reference.

TECHNICAL FIELD

The present invention relates to the field of architecture, building, design and property evaluation. In particular to a method, system and software for determining a region of light in a specified area and to a method, system and software for determining a region of visibility in a specified area.

BACKGROUND

There are many people who would be interested in the amount of sunlight that apartments, houses, gardens, parklands and other areas would receive at a specific point in time or over a period of time. Architects, designers, regulators and purchasers of property typically use direct sunlight as a means for evaluating a property.

Prior art in this field uses backwards ray tracing. This means that the light rays are traced in the opposite direction to which they naturally follow. That is, the light is traced from the light receiving point to the light source taking into account the physical interactions with the object of the scene. One issue with this approach is that it is computationally difficult to create a three dimensional region of light because the light receiving point is assumed to be a single point.

Further, the determination of light from a light source such as the sun in the prior art is typically based on a grid super imposed upon the surface of a plane above the floor of the specified area such as an apartment. Although this is an approximation of the amount of sunlight the specified area can receive, it is not particularly accurate. In addition, it is difficult to calculate sunlight at any other position other than on the plane unless more grid points were used.

Any discussion of documents, acts, materials, devices, articles or the like which has been included in the present specification is not to be taken as an admission that any or all of these matters form part of the prior art base or were common general knowledge in the field relevant to the present disclosure as it existed before the priority date of each claim of this application.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

SUMMARY

A computer implemented method for determining a three dimensional region of light in a specified area that receives light from one or more sources of light comprising: determining location information of the specified area; estimating one or more positions of the respective one or more sources of light; determining one or more light attenuating objects; and determining a three dimensional region of light in the specified area that receives light from the one or more sources of light based on: location information of the specified area, the one or more positions of the one or more sources of light, and the one or more light attenuating objects in a path of light between the one or more sources of light and the specified area, wherein the three dimensional region of light has a defined non-zero volume.

A three dimensional region of light that has a defined non-zero volume is a different approach to determining sunlight and light from other light sources (such as those that merely determine light at multiple discrete areas across a two dimensional surface). This approach simplifies the determination of light while retaining accuracy and therefore provides a less computationally expensive approach to accurately determining an amount of sunlight. A three dimensional region of light is useful in many ways. For example, one or more three dimensional regions or one or more planes can be intersected with the three dimensional region of light at any point or any height without having to retrace or recalculate the amount of light. Further, the three dimensional region of light can be represented as a three dimensional geometric shape such as a solid, where a solid is a three dimensional geometric object. This assists both in visualising sunlight as a geometric shape and calculating the volume of this shape. Both the shape and volume of the three dimensional region of light allow for metrics by which the amount of light that different apartments, houses, gardens, parklands and other areas receive can be quantitatively compared.

Preferably, the step of determining a three dimensional region of light in the specified area is based on a first position of a source of light at a first time and a second position of the source of light at a second time.

Preferably the three dimensional region of light is determined using forward projection of the path of light from the one or more positions of the one or more sources of light to the specified area.

Preferably the three dimensional region of light is determined as a three dimensional geometric shape.

Preferably the method further comprises determining a volume of the three dimensional region of light.

Preferably determining a three dimensional region of light in the specified area comprises determining a first set of light attenuating objects and determining an approximate region of light based on the first set of light attenuating objects.

Preferably, the approximate region of light and the refined region of light are determined by forward projection of the path of light from the one or more positions of the one or more sources of light to the specified area.

The method may further comprise determining the first set of light attenuating objects between the specified area and the one or more sources of light comprises determining one or more opaque walls.

The method may further comprise determining the first set of light attenuating objects comprises determining one or more translucent objects.

Translucent objects may be one or more of: windows; door openings; and skylights.

Preferably the method comprises determining a three dimensional region of light in the specified area comprises determining a second set of light attenuating objects and determining a refined three dimensional region of light based on the first and second sets of light attenuating objects.

The method may further comprise determining a refined three dimensional region comprises determining surrounding context that includes one or more of the second set of light attenuating objects.

Surrounding context that is in a path of light between the specified area and the one or more sources of light includes: buildings; trees; vegetation; structures; or any other light attenuating object.

The method may further comprise determining a refined three dimensional region of light comprises determining one or more shading elements.

The method may comprise determining a refined three dimensional region of light comprises determining a region of shadow in the specified area.

Preferably the method comprises determining a refined three dimensional region of light comprises subtracting a region of shadow in the specified area from the approximate region of light in the specified area.

The method may further comprise determining one or more specified planes extending through the specified area that intersects the three dimensional region of light.

The method may further comprise determining a grading of the three dimensional region of light according to the distance from a light source.

The method may further comprise determining a grading of the three dimensional region of light according to multiple positions of the one or more source of light.

The method may further comprise further comprising determining one or more specified three dimensional regions in the specified area and determining one or more sub-parts of the one or more specified three dimensional regions that intersect the three dimensional region of light.

The method may further comprise calculating a proportion of a first specified plane that intersects the three dimensional region of light in the specified area.

The method may further comprise calculating a proportion of the one or more specified planes that is formed by the three dimensional region of light at multiple respective positions of the one or more sources of light at multiple respective times.

The method may further comprise determining a ranking of specified areas based on the proportion of the specified area that is formed by the three dimensional region of light.

The method may further comprise determining a ranking of specified areas based on the proportion of one or more specified planes extending through a specified area that intersect the three dimensional region of light.

Preferably the specified area is defined in a three dimensional model.

Preferably the three dimensional model comprises one or more of: floor slabs; roof structures; roof slabs; walls; windows; door openings; external object outlines; internal object outlines; internal space volume; shading elements; surrounding context; target object outline; observer object outline; and privacy obstruction elements.

The method may further comprise determining the specified area from a two dimensional floor plan by constructing a three dimensional model of the specified area from the two dimensional floor plan.

The specified area may comprise one or more rooms that correspond with one or more rooms in a two dimensional floor plan.

The step of determining a three dimensional region of light may comprise determining a three dimensional region of light in one or more rooms.

The method may further comprise displaying a visual representation of the three dimensional region of light and the specified area.

Preferably displaying a visual representation of the three dimensional region of light includes one or more of: two dimensional representation; three dimensional representation; charts; graphs; tables; raw data; and interactive visual display.

Software, being machine readable instructions, that when performed by a computer system causes the computer system to perform the method described above.

A computer system for determining a three dimensional region of light in an specified area that receives light from one or more sources of light comprising:
a processor:
  to determine location information of the specified area;
  to estimate one or more positions of the one or more sources of light;
  to determine one or more light attenuating objects; and
  to determine a three dimensional region of light in the specified area that receives light from the one or more sources of light based on:
    location information of the specified area,
    the one or more positions of the one or more sources of light, and
    the one or more light attenuating objects in a path of light between the one or more sources of light and the specified area,
wherein the three dimensional region of light has a defined non-zero volume.

A computer implemented method for determining a three dimensional region of visibility in an specified area visible from one or more view locations comprising:
determining location information of the specified area; estimating one or more view locations;
determining one or more visibility attenuating objects; and
determining a three dimensional region of visibility in the specified area visible from one or more view locations based on:
location information of the specified area, the one or more view locations and the one or more visibility attenuating objects in a path of visibility between the one or more view locations and the specified area.

Preferably, determining the three dimensional region of visibility in the specified area comprises determining a first set of visibility attenuating objects and determining an approximate region of visibility based on the first set of visibility attenuating objects.

Preferably, determining a first set of visibility attenuating objects between the specified area and the one or more view locations comprises determining one or more opaque walls.

Preferably, determining the first set of visibility attenuating objects comprises determining one or more translucent objects.

Preferably, translucent objects include one or more of: windows; door openings; and skylights.

Preferably, determining a three dimensional region of visibility in the specified area comprises determining a second set of visibility attenuating objects and determining a refined three dimensional region of visibility based on the first and second sets of visibility attenuating objects.

Preferably, determining the refined three dimensional region of visibility comprises determining surrounding context that includes one or more of the second set of visibility attenuating objects.

Preferably, surrounding context that is in a path of visibility between the specified area and the one or more view locations includes: buildings; trees; vegetation; structures; or any other visibility attenuating object.

Preferably, determining the refined three dimensional region of visibility comprises determining one or more shading elements.

Preferably, determining the refined three dimensional region of visibility comprises determining a region of concealment in the specified area.

Preferably, determining the refined three dimensional region of visibility comprises subtracting a region of concealment in the specified area from the approximate three dimensional region of visibility in the specified area.

The method may further comprise determining a specified plane extending through the specified area that intersects the three dimensional region of visibility.

The method may further comprise determining a grading of the three dimensional region of visibility according to the distance from a view location.

The method may further comprise determining a grading of the three dimensional region of visibility according to multiple respective view locations.

The method may further comprise determining a ranking of specified areas based on the proportion of the specified area that is formed by the region of visibility.

Preferably, the specified area comprises one or more rooms that correspond with one or more rooms in a two dimensional floor plan.

Preferably the step of determining a three dimensional region of visibility comprises determining a three dimensional region of visibility in one or more rooms.

Software, being machine readable instructions, that when performed by a computer system causes the computer system to perform the method described above.

A computer system for determining a three dimensional region of visibility in an specified area visible from one or more view locations comprising:
 a processor:
  to determine location information of the specified area;
  to estimate one or more view locations;
  to determine one or more visibility attenuating objects; and
  to determine a three dimensional region of visibility in the specified area visible from one or more view locations:
   location information of the specified area,
   the one or more view locations and
   the one or more visibility attenuating objects in a path of visibility between the one or more view locations and the specified area.

BRIEF DESCRIPTION OF DRAWINGS

Examples of the present disclosure will be described with reference to:

FIG. 6b illustrates an three dimensional model derived from the two dimensional floor plan in FIG. 6a.

FIG. 22b illustrates a second example View Range Volume intersected with the internal volume of the specified area from the same observer opening as FIGS. 16 to 21a.

FIG. 24b illustrates an example three dimensional region of visibility graded by distance and without three dimensional region of concealment from FIG. 23a.

FIG. 29b illustrates a three dimensional region of light produced by the arrangement of light sources in FIG. 29a.

DESCRIPTION OF EMBODIMENTS

In one embodiment, this disclosure describes a computer implemented method for determining a three dimensional region of light in an specified area that receives light from one or more source of light. This method may achieve this taking account the location information of the specified area, the position(s) of the source of light and one or more light attenuating objects.

In this disclosure a three dimensional region of light is a defined shape where the shape represents the shape of the light that the specified area receives. The three dimensional region of light has a number of properties: each dimension of the three dimensional region of light is non-zero; the length of each of the dimensions is a positive (greater than zero) number; and the three dimensional region of light has a defined non-zero volume, where volume is the magnitude of the three dimensional space enclosed within or occupied by an object or geometric solid. The volume of the three dimensional space is non-zero, that is, greater than zero and defined in the sense that the boundaries or limits of the three dimensional space are set.

A three dimensional region of light is distinct from a two dimensional region of light which could be considered to be either lacking a third dimension or having a zero-length third dimension. Similarly, a two dimensional region of light does not have a defined non-zero volume. For example, a two dimensional region of light may, in one example, merely define light that reaches a two dimensional surface such as a floor. It may not indicate how or where the light passes the specified area. The three dimensional region of light as determined by the system corresponds to and represents a real three dimensional region of light.

The three dimensional region of light may be determined in many different ways including as a solid geometric figure, a polyhedron, a set of points or a set of lines. The geometry of the three dimensional region of light depends on the geometry of the specified area and other factors, but examples of a three dimensional region of light include spheres, prisms, cones, cylinders, truncated cones, pyramids, cubes, octahedron, dodecahedron and many others.

Example System

Figure 1:
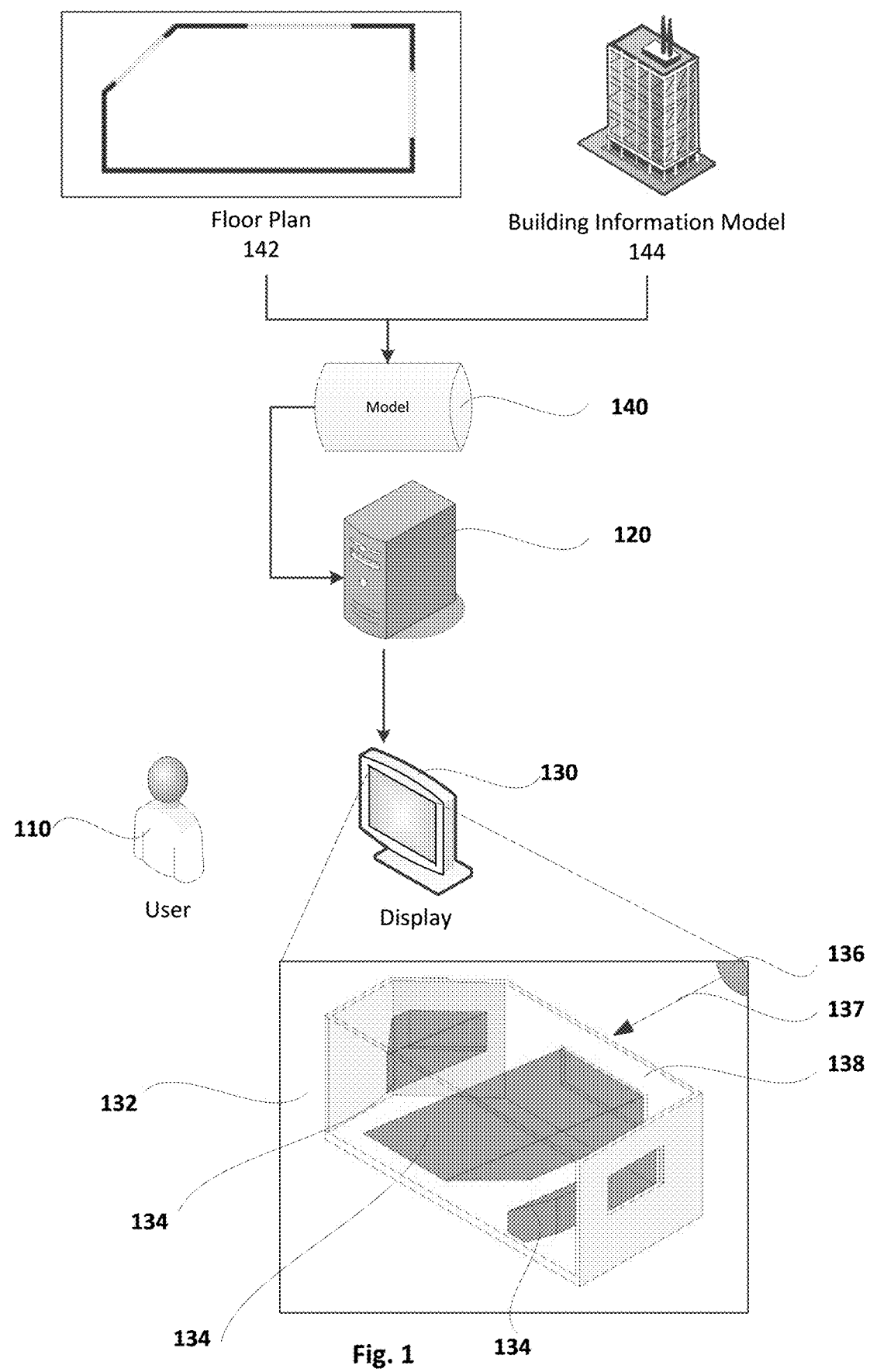
FIG. 1 illustrates an example system for determining a three dimensional region of light.

FIG. 1 is an illustration of an example system for determining a three dimensional region of light in a specified area 132 that receives light from one or more sources of light.

FIG. 1 shows a user 110 of a system 120 with a display 130 with a data store 140 that stores model related data about the specified area 132. The specified area in this case is an apartment in a building that is yet to be built. An architect has produced a floor plan 142 for apartment and a building information model 144 has been created for the building that comprises the apartment.

User 110 may typically be an architect, designer, builder or property purchaser. In this example, the user 110 is a property purchaser who wishes to purchase an apartment off the plan without having seen the apartment as it is not yet built and wishes to use this system to understand how much sunlight the apartment may receive at various times of the year. The system can display on the display 130 a visualisation of a three dimensional region of light 134 in the specified area, in this case, the apartment.

Example Method

Figure 2:
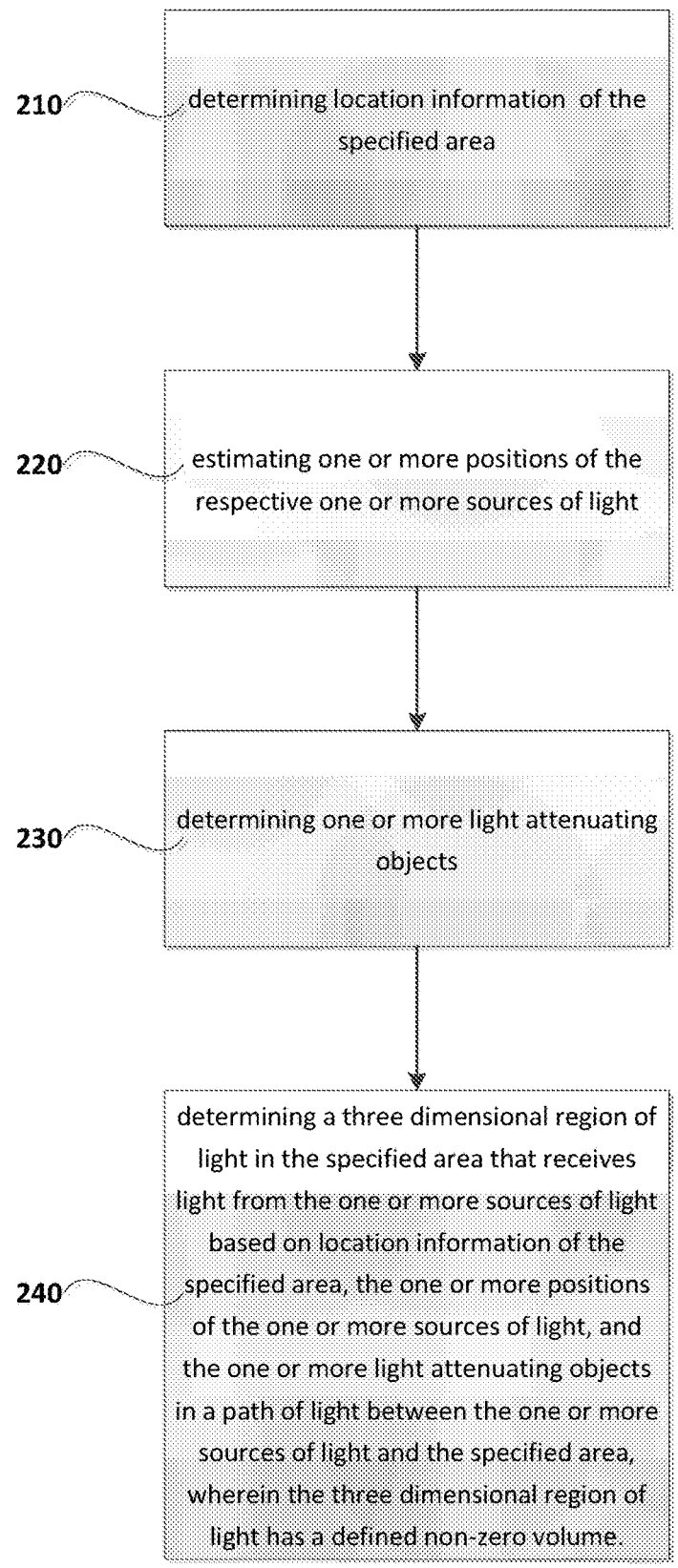
FIG. 2 illustrates a computer implemented method for determining a three dimensional region of light.

FIG. 2 is an example illustration of the method of determining a three dimensional region of light in a specified area that receives light from one or more sources of light. First the system determines 210 the location information of the specified area. Continuing the example of FIG. 1, the location information may be the position of the apartment in the building and the orientation of the apartment. It does not need to be precise, although the more precise the location information is the more accurate the end result will be. For example, the system could utilise the latitude and longitude of the building to provide a very precise calculation. On the other hand, at a very basic level, the location information may simply be the relative position of the specified area in relation to the light source or even just a general locality, state or country in which the specified area is located.

Once the location information has been determined, the system 120 can estimate 220 one or more positions of the respective one or more sources of light. In the example of FIG. 1, there is only one source of light 136 and that is the sun. Typically the source of light would be the sun, however the method is equally applicable to the determination of a three dimensional region of light 134 from an artificial light source such as down lights, streetlights, floodlights, car headlights, stadium lights and so on.

The system then determines 230 one or more light attenuating objects 138. Light attenuating objects 138 are any objects that may affect the transmission of light. Light attenuating objects may be simply the walls and any other structures. In the example of FIG. 1, the light attenuating objects are the walls of the apartment.

Then the system determines 240 a three dimensional region of light in the specified area that receives light from the one or more sources of light 136 based on location information of the specified area, the one or more positions of the one or more sources of light 136, and the one or more light attenuating objects in a path of light 137 between the one or more sources of light and the specified area.

Example Application to an Apartment

Figure 3:
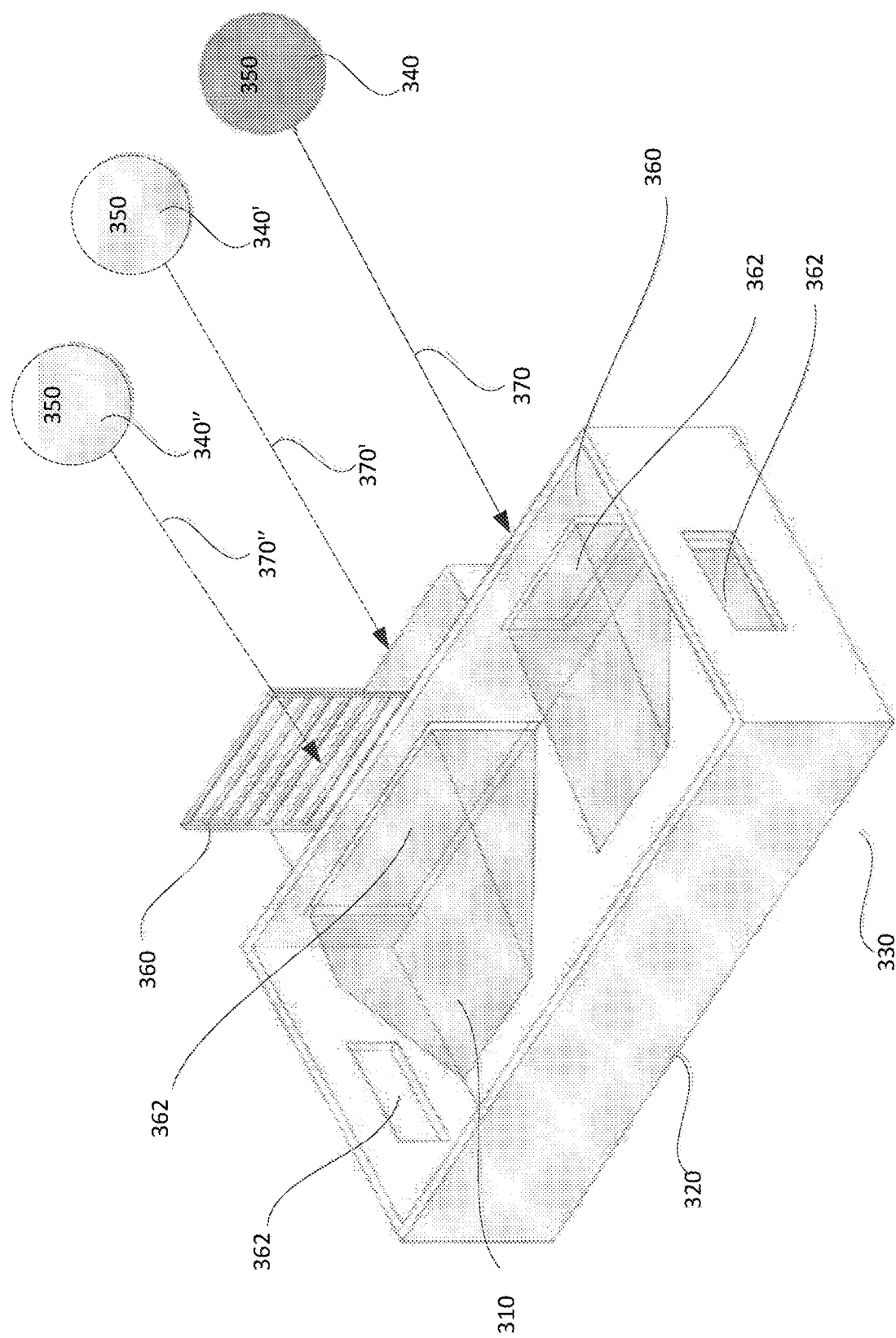
FIG. 3 illustrates an example application to an apartment.

FIG. 3 is an example illustration of the method for determining a three dimensional region of light 310 in the specified area 320. The specified area 320 in this case is an apartment. In this example, an architect wishes to determine a region of light in the apartment that is formed by sun at the winter solstice. The position of the sun would be calculated to be where the sun would be for the winter solstice for the relevant year that the architect is concerned about. Because the apartment is not yet built the architect is looking at the position of the sun in the winter solstice for 2017 at the precise position (in latitude and longitude) where the apartment is to be built. The system determines 210 that the location information 330 in this example is that the orientation of the apartment is south and therefore the main windows are facing in a westerly direction.

As above, in this example, the source of light 350 is the sun. Therefore the system is able to estimate 220 one or more positions 340, 340', 340" of the sun 350. In this example, the user 110 wishes to calculate the region of light in the late afternoon so the system can estimate a position of the sun in the westerly section of the sky at the winter solstice. The positions of the sun 340, 340', 340" can be calculated based on the location, provided in the model or the system can communicate with a third party server that contains the data for the given location.

Once the position 340, 340', 340" of the sun is estimated, the light attenuating objects 360 can be determined. The system then determines 230 one or more light attenuating objects 360. In this case, the light attenuating objects 360 are walls and a louvre 360. The windows 362 of the apartment are translucent and hence do not attenuate light to any significant extent. In this example, given that no information about the windows is provided in the model, the system defaults to an assumption that windows are clear and substantially transparent. However, the same method can be applied to less transparent windows. For example, if the windows were frosted, then the degree of light that is attenuated depends on the degree of frosting of the window. This information would typically be provided by the model, however the user 110 may select a degree of light attenuation of the windows if so desired.

In this example, the one or more light attenuating objects between the specified area and the one or more sources of light are one or more opaque walls. Typically at least one wall of the specified area would affect the determination of the three dimensional region of light. However, there may be a few examples such as greenhouses or glasshouses where the walls do not attenuate the light to any significant extent.

The individual objects within the specified area may be modelled in order to provide a more accurate determination. Furnishings of an specified area such as tables, chairs, sofas and other objects can be modelled for example to show where they may likely be positioned for light or to reduce the shadowing effects caused by the furnishings.

At this point there can be a calculation performed to determine 240 the three dimensional region of light 310 based on the location information 330 of the specified area 320, the position 340 of the sun 350, and the light attenuating objects 360 in a path of light 370 between the one or more sources of light and the specified area. Given that sunlight is effectively parallel from the sun, the path of light is equivalent to a single direction. As such, the light attenuating objects in the path of light are those walls and louvre that are situated between the sun and the specified area. If there were additional objects such as buildings in the path, then this would affect the calculation of the region of light.

Once the three dimensional region of light is determined, the volume of the three dimensional region of light is defined and non-zero if each of the dimensions of the three dimensional region of light is non-zero. The volume of the three dimensional region of light may be calculated based on the shape using volume calculation techniques.

Preferably the three dimensional region of light is determined utilising the path of light from the one or more positions of the one or more sources of light to the specified area. This can be referred to as the forward projection of light, which differs from ray-tracing which traces rays backwards (that is, from the specified area towards a source of light). In this way, forward projection of light means that the determination of the three dimensional region of light follows how the light really travels through most spaces where photons are emitted from a light source and travel in a straight line path until they hit a surface of an object.

The three dimensional region of light is therefore useful as a real-world model of light. For example, the architect could arbitrarily place an object (such as a yet-to-be-approved multi-storey development in the near vicinity of the specified area) in or near the three dimensional region of light to see the change in shape of the three dimensional region of light (and the potential shadowing effects caused by the object) without having to recalculate the region of light.

Conceptual Description

Figure 4A:
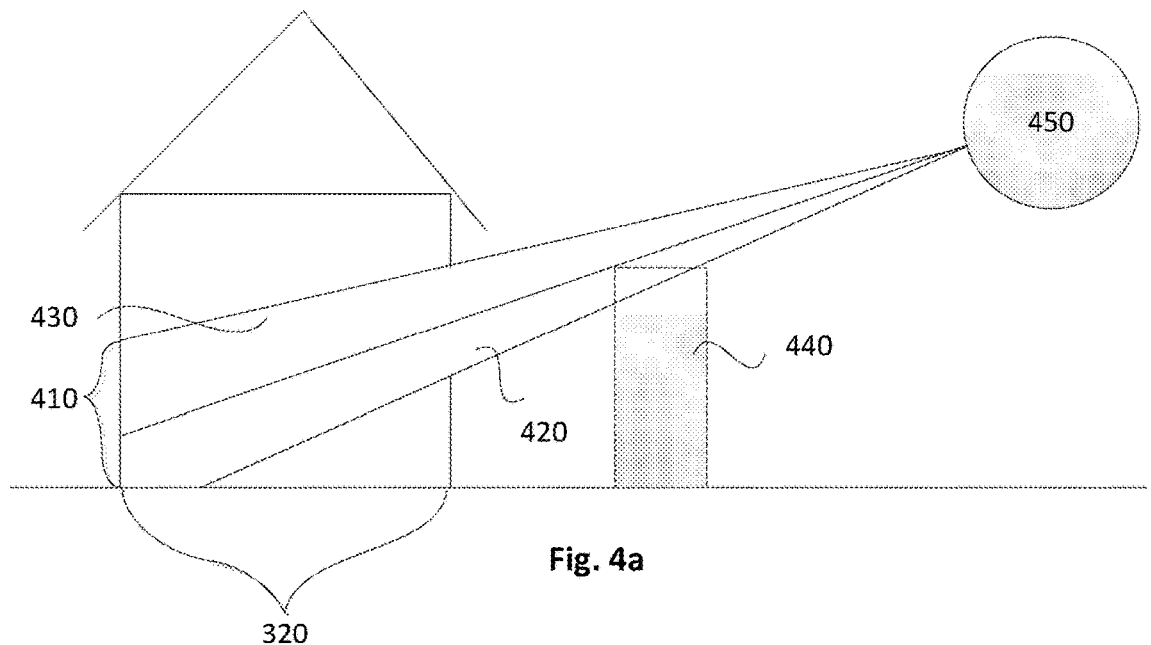
FIG. 4a is a conceptual illustration of determining a three dimensional region of light

The method of determining 240 the three dimensional region of light 310 is illustrated conceptually in FIG. 4a. Preferably, in this method, the approximate three dimensional region of light 410 is determined first. Then the light attenuating objects 440 in the path of light between the specified area 320 and the source of light 450 are determined. Then the system 120 determines a region of shadow 420 formed by the light attenuating objects 440. Finally a refined three dimensional region of light 430 is determined by subtracting the region of shadow 420 from the approximate three dimensional region of light 410.

Specified Plane

Figure 4B:
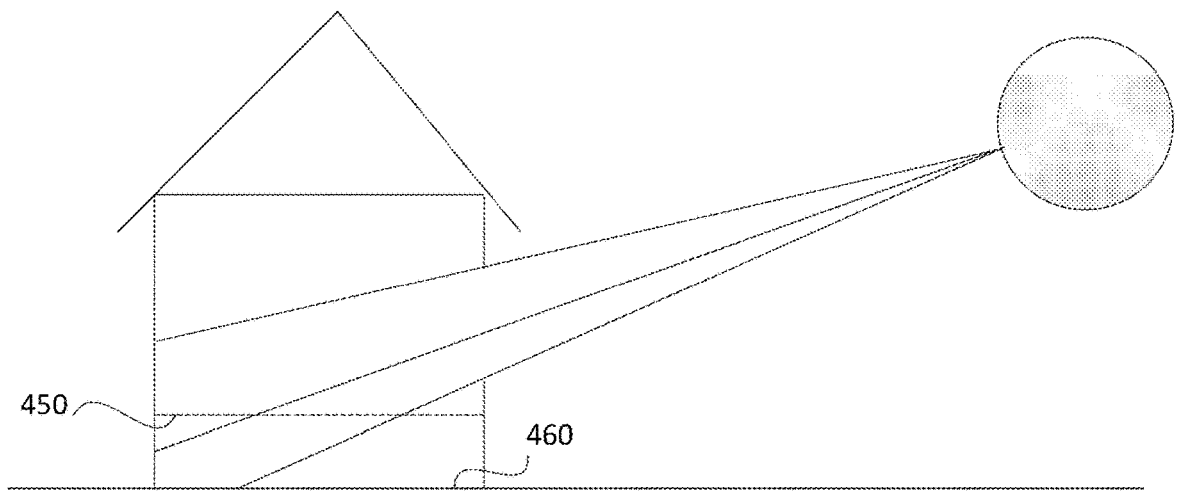
FIG. 4b is a conceptual illustration of determining a specified plane
Figure 5:
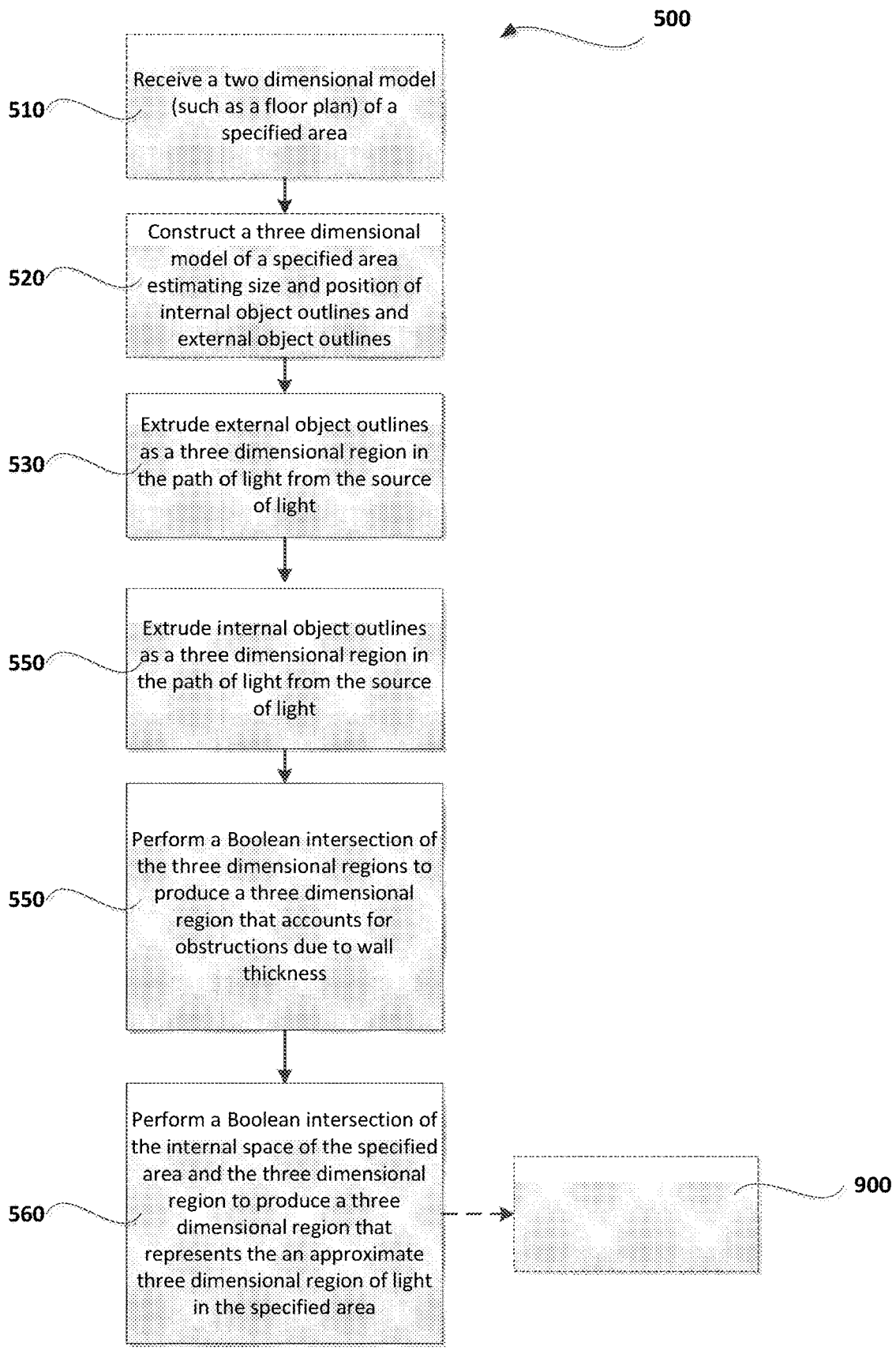
FIG. 5 illustrates a computer implemented method for determining the approximate three dimensional region of light within a specified area.

Continuing further with the conceptual illustration, a specified plane 450 can be intersected with the refined region of light 430. It may be difficult to visualise the three dimensional region of light 410, 430 in the specified area 320 so it may be easier to visualise a two dimensional plane 450 that intersects the three dimensional region of light. Further, regulations for new apartments may require determining a plane of light at 1 metre above the floor. In order to make such a calculation a two dimensional specified plane extending through the specified area can be projected such that it intersects the region of light. FIG. 4b illustrates a specified plane that is 1 metre above the floor 460.

Importantly a specified plane may intersect with the region of light at any point. Because the region of light is independent from a specified plane, a plane may be moved, changed or altered without having to re-determine the region of light. Multiple planes can be intersected with the region of light and the planes may therefore be compared to each other. For example, it may be useful to compare the amount of light at 1 metre above the floor to the amount of light on the floor.

It is also possible to compare two or more specified planes that are not necessarily parallel. For example a plane coextensive with the floor of the specified area may be compared against a plane that is coextensive with the ceiling of the specified area but where the ceiling has been designed to have an incline of 15° degrees.

Specified Region

Similar to a specified plane, a specified three dimensional region in the specified area can be intersected with the three dimensional region of light to determine a sub-part of the specified three dimensional region that receives light. The specified three dimensional region in the example of an office may be, for example, the region between 1 metre above the floor to 2 metres above the floor as this is the region most affected by glare. The specified three dimensional region may extend through the specified area. The sub-part may be the entire specified three dimensional region. For example, in some cases, the entire specified three dimensional region may be a sub-part that receives light where there is no sub-part of the specified three dimensional region that is not intersected by the three dimensional region of light.

Specified Location

It is also possible to determine a location of light in the three dimensional region of light. A location of light is a point of light and may be used where a point of light is an important consideration. For example, a location of light is important in designing gardens where certain plants require a certain amount of direct sunlight per day. A location of light in the three dimensional region of light for the garden may indicate the position for planting according to the amount of sunlight available.

Determining the Three Dimensional Region of Light

Determining the three dimensional region of light based on the location information of the specified area, the position of the sun, and the light attenuating objects in a path of light between the one or more sources of light and the specified area includes the following four steps:

1. Construct a three dimensional model
2. Determine an approximate region of light
3. Determine region of shadow
4. Determine refined region of light by subtracting region of shadow from the approximate region of light Constructing a three dimensional model may be required when the model that is provided to the system is a floor plan or other two dimensional model. Steps 3 and 4 may not be required where the context of the specified area is not known or where the approximate region of light is useful in itself.

There is also an optional further step 5: This step that allows for the determination of a specified plane extending through the specified area that intersects the region of light. The specified plane 450 can be used to more simply visualise the amount of light from the source of light, or may be a tool for further analysis.

FIG. 4 is an example illustration of a method for determining 240 a three dimensional region of light in the specified area that receives light from the one or more sources of light based on location information of the specified area, the one or more positions of the one or more sources of light, and the one or more light attenuating objects in a path of light between the one or more sources of light and the specified area.

Construct a Three Dimensional Model

The specified area may be defined in a three dimensional model. Typically the model would include:
  a. floor slabs;
  b. roof structures;
  c. roof slabs;
  d. walls;
  e. windows;
  f. door openings;
  g. external object outlines;
  h. internal object outlines;
  i. internal space volume;
  j. shading elements;
  k. surrounding context massing;
  l. target object outline;
  m. observer object outline; and
  n. privacy obstruction elements.

It is preferable that a three dimensional model is to be used, however, the specified area may be determined from a two dimensional floor plan or a combination of one or more three dimensional models and one or more two dimensional models. Many models of specified areas known in the art are three dimensional and therefore it is unnecessary to construct a three dimensional model. Example models include Computer Aided Design (CAD) files, Building Information Models (BIM), Industry Foundation Classes (IFC) or other similar formats, as well as data formats such as Green Building Extensible Markup Language (gbXML) or Construction Operations Building Information Exchange (CO-Bie).

A model of a specified area in the above formats would typically contain data representing internal object outlines and external object outlines, specifically outlines of floors, walls, roof structures, windows, door openings and skylights. Although preferable, it is not necessary for the model to contain both internal and external outlines in that it may contain either internal, external outlines, or an estimated outline. It is possible that the model may not contain the outlines at all. In which case, a two dimensional floor plan can be used in conjunction with the three dimensional model to estimate positions of the objects such as windows, door openings, and skylights as per the method below for two dimensional models.

Where a two dimensional model is used, the specified area can be determined by constructing a three dimensional model of the specified area from the two dimensional floor plan. This may be advantageous where there is insufficient data in a three dimensional model to determine the specified area. It may also be advantageous where computational resources need to be used effectively as it may be significantly less of a computational burden to use a two dimensional floor plan. Finally, the floor plan may simply have more data that is relevant to the determination of the region of light in which case it may simply be easier to use the floor plan.

Where the system 120 receives 510 a two dimensional model such as a floor plan, the system 120 will construct 520 a three dimensional model of the specified area. As much of the data in a three dimensional model is not included in a floor plan, this step typically involves making a number of assumptions about ceiling height, the size and position of windows and other openings in the three dimensional space. The assumptions can be based on basic window shapes, statistically likely window positions, or data obtained from architects, builders, stored data on the system or other data providers. Alternatively the user 110 can select parameters to position windows or light attenuating objects themselves.

Figure 6A:
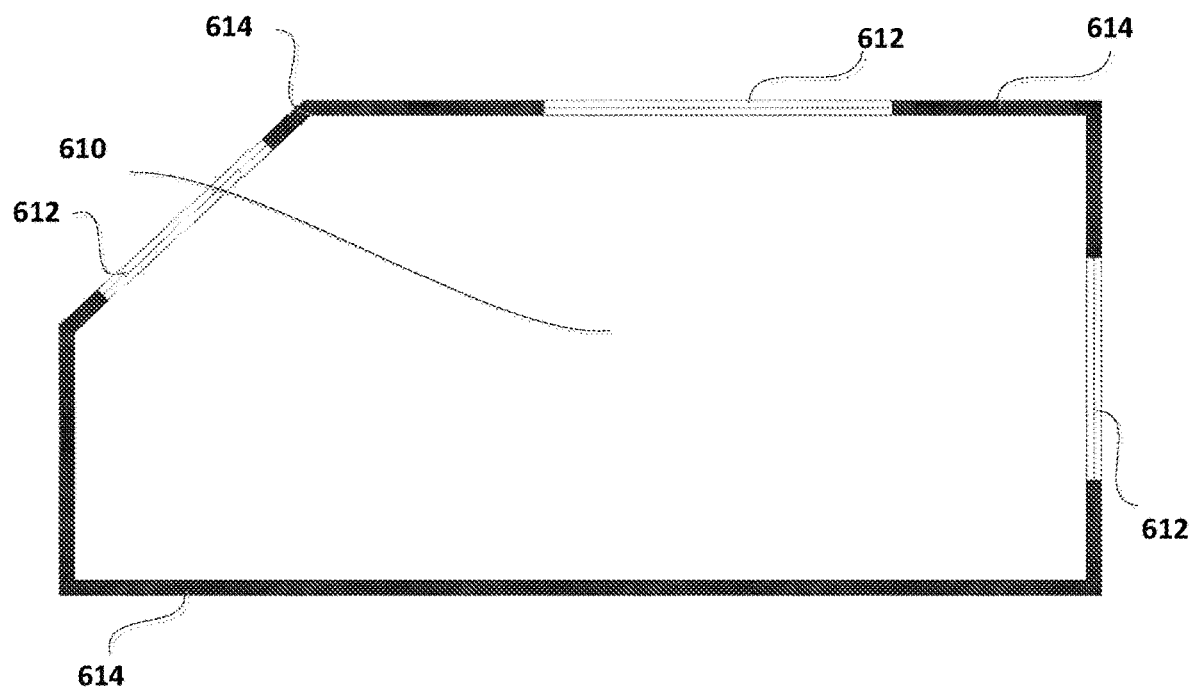
FIG. 6a illustrates an example two dimensional floor plan.
Figure 6B:
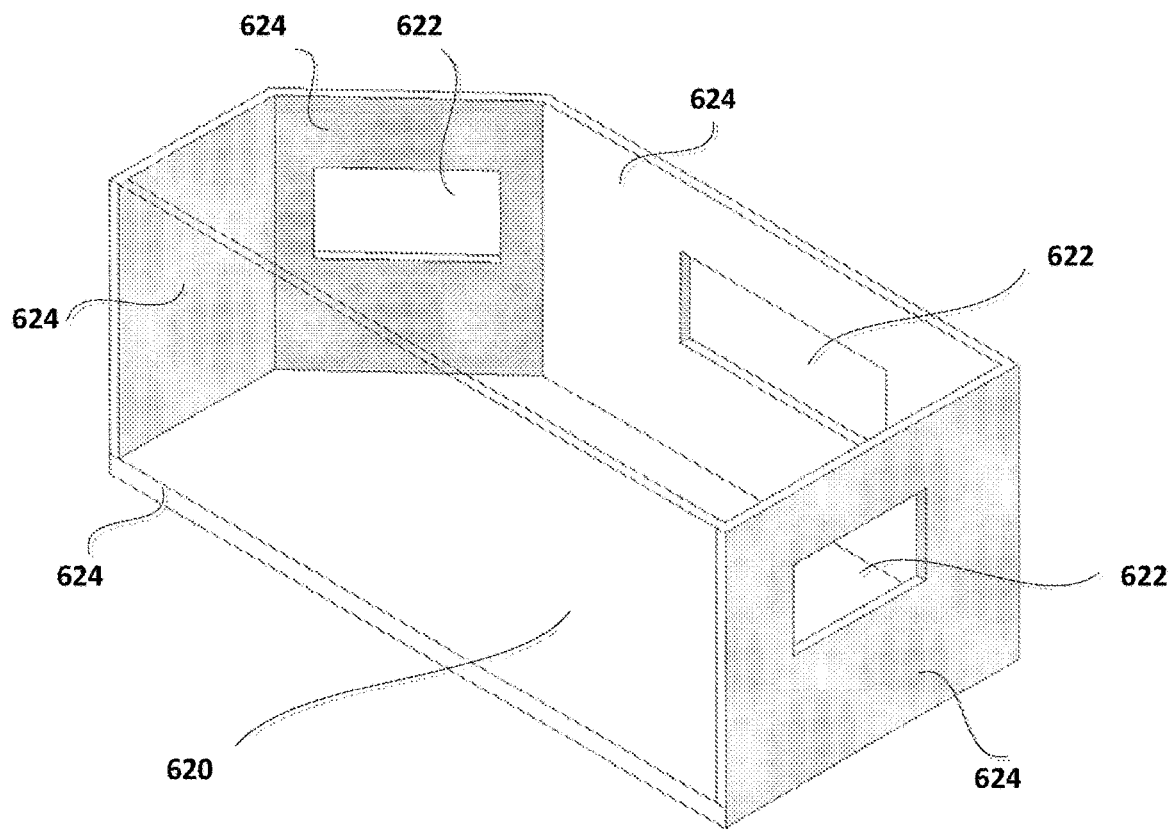

Referring back to FIG. 1, the floor plan 142 that comprises the model 140 is received 510 by the system 120. FIG. 6a illustrates an example basic two dimensional floor plan 610 that is identical to the floor plan 142. The dark lines represent walls 614 and the thinner lines represent the windows 612. Because the model is two dimensional the system 120 creates a third dimension by making some statistically likely assumptions about the ceiling height and window positions. A representation of the three dimensional model 620 that is derived from the two dimensional floor plan FIG. 6a is shown in FIG. 6b. As illustrated, windows 622 in the three dimensional model correspond to the windows 612 in the two dimensional model. Similarly, the walls 624 in the three dimensional model correspond to the walls 614 in the two dimensional model.

Approximate Region of Light

Determining the three dimensional region of light 310 in the specified area may comprise determining a first set of light attenuating objects and determining an approximate region of light 410. The first set of light attenuating objects are those light attenuating objects associated with the specified area such as walls, floors, roofs and ceilings. An approximate region of light is the three dimensional region of light formed by the first set of light attenuating objects.

The approximate region of light may not take into account any potential shadowing effects caused by objects that are not in the first set of light attenuating objects such as buildings 440 or other structures in the path of light between one or more light sources and the specified area 320. This would be advantageous where the context, that is the shape of buildings, vegetation or other light attenuating objects in the surrounding area, may not be known. As the approximate region of light does not take into account shadowing, when the steps are performed in this order the approximate region of light 410 represents the a rough overestimate of the amount of light that is to be received by the specified area. That is, any further calculations or refinements will only reduce the determined region of light.

Figure 7A:
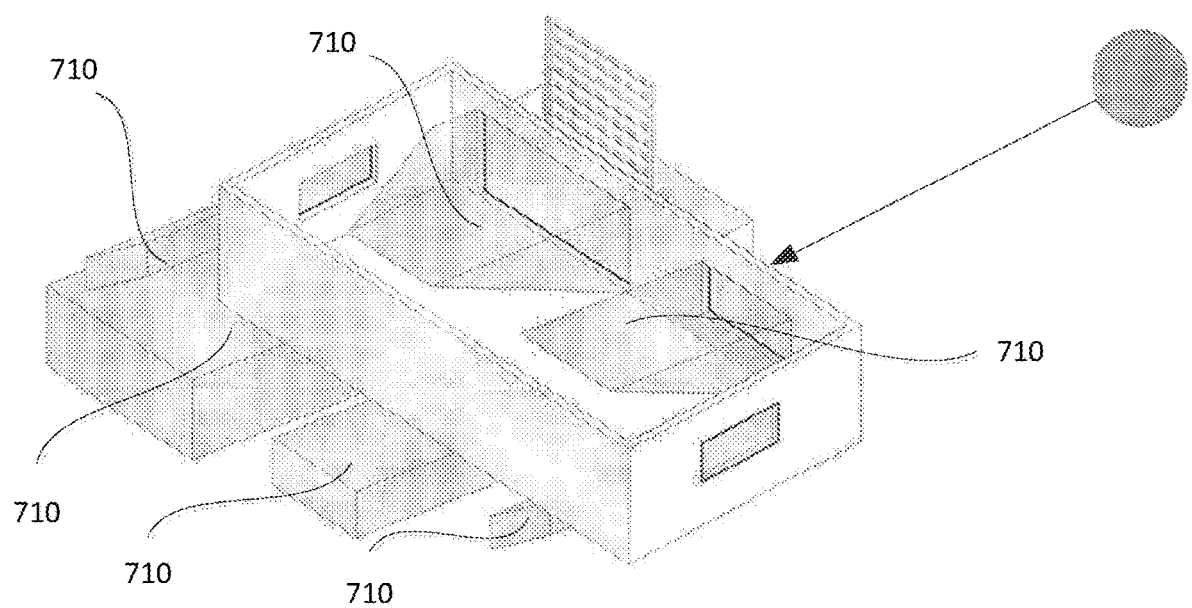
FIG. 7a illustrates an example three dimensional region produced by the external window geometry.

The first step involves extruding 530 external object outlines as a three dimensional region in the path of light from the source of light. Extruding is a command in Auto-CAD and similar programs which allows for a three dimensional solid object to be created from a two dimensional polygon. In this step, the two dimensional polygon is the external object outlines that typically form the external dimensions of windows, door openings and skylights. External in this case just means those objects on the outer surface or side of walls or other light attenuating objects. This step produces a first three dimensional region 710. FIG. 7*a* is an illustration of the first three dimensional region 710.

Figure 7B:
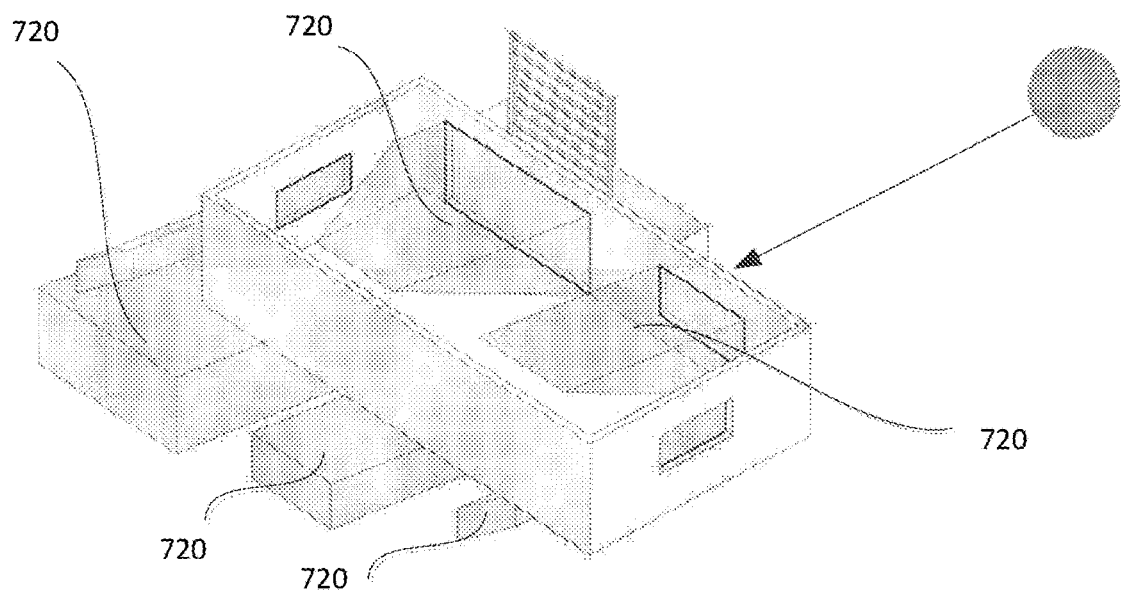
FIG. 7b illustrates an example three dimensional region produced by the internal window geometry.

A related step involves extruding 540 internal object outlines as a three dimensional region in the path of light from the source of light. This involves a similar extrude command as above. The difference being in this step, the two dimensional polygon is the internal object outlines that typically form the internal areas of windows, door openings and skylights. This produces a second three dimensional region 720. FIG. 7*b* is an illustration of the second three dimensional region 720.

Figure 8A:
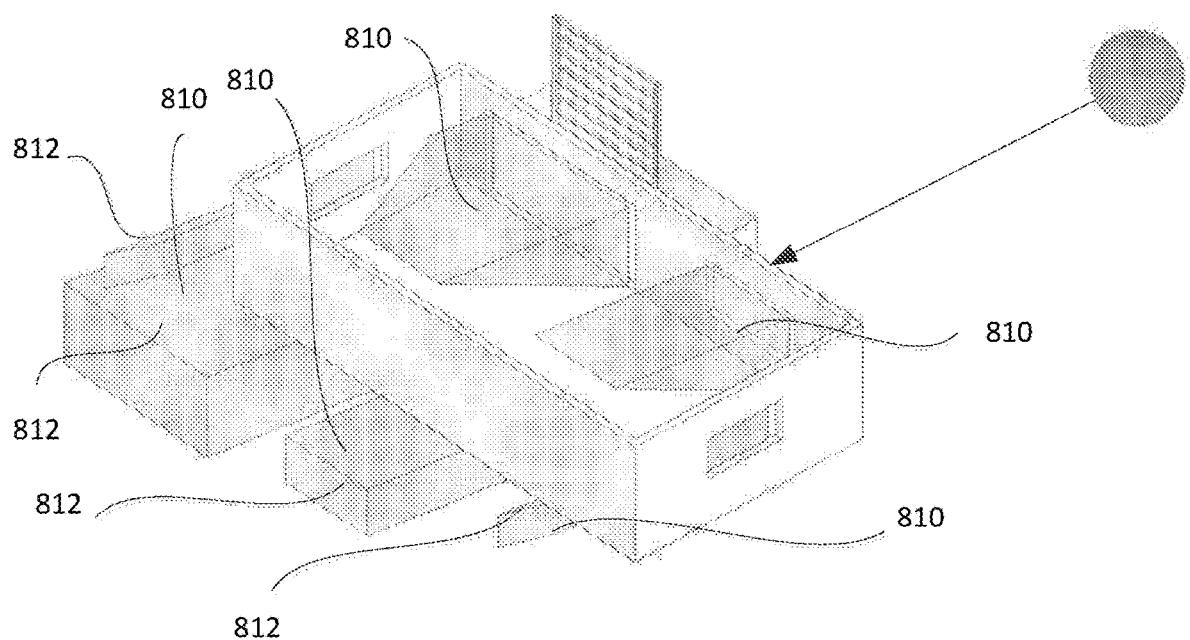
FIG. 8a illustrates an example three dimensional region by intersecting the two three dimensional regions in FIG. 7a and FIG. 7b.
Figure 8B:
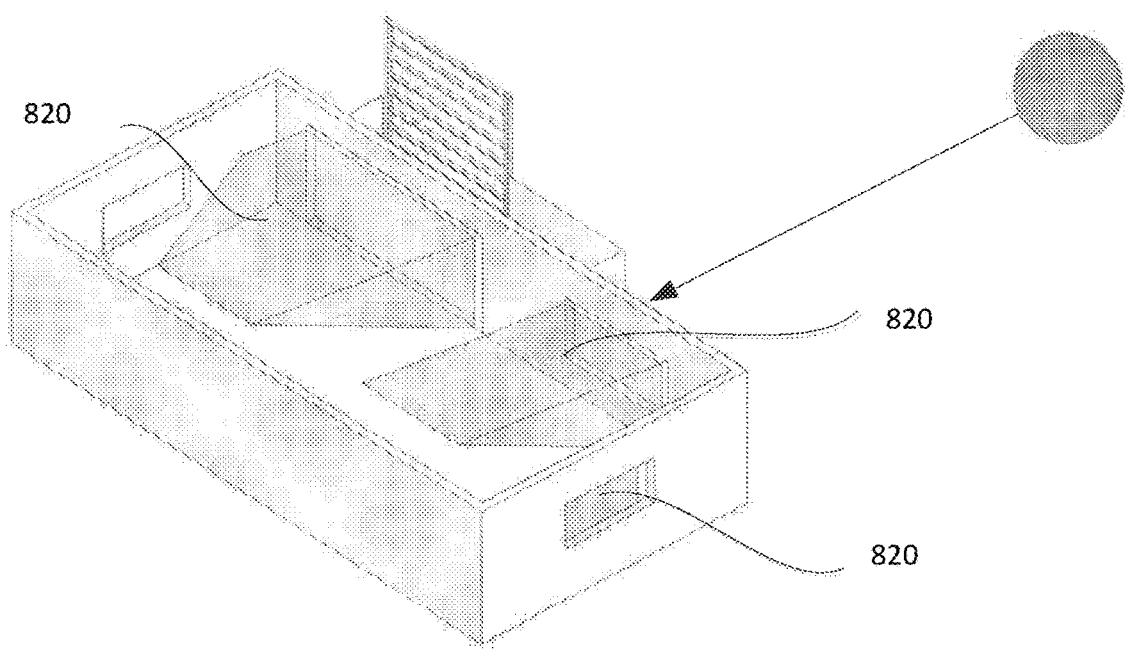
FIG. 8b illustrates an example three dimensional region by intersecting the three dimensional region in FIG. 8a with the floor of the apartment.

By performing 550 a Boolean Intersection on the two three dimensional regions 710 and 720, there is produced a third three dimensional region 810 that accounts for obstructions due to wall thickness. Wall thickness is important to take into account as the wall can provide a significant light attenuation on the specified area. FIG. 8*a* illustrates the three dimensional region 810 that accounts for obstructions due to wall thickness.

Once the three dimensional region 810 has been produced, the next step 560 involves performing a Boolean intersection of the internal space of the specified area and the three dimensional region 810. The internal space of the specified area may be defined in the model, or may be calculated based on available dimensions in the model. This step produces a three dimensional region 820 that represents the approximate three dimensional region of light within the specified area.

This step eliminates any parts of the three dimensional region 810 that are outside the bounds (see 812 in FIG. 8*a*) of the specified area. This reflects the fact that the floor and walls typically would attenuate the light. Even where the floor or walls were translucent, the relevant space for the determination of the three dimensional region of light is the specified area. If the light outside the specified area is relevant to the user 110, the system 120 can increase the specified area to include the additional parts relevant to the user.

Once the process 500 has been performed, the system may optionally perform the method 900 which takes an approximate three dimensional region of light and determines a refined three dimensional region of light. It is to be appreciated however that method 900 can be performed before method 500. In this case, the refined region of light is determined first, and the approximate region of light is added.

Refined Region of Light

In comparison to the approximate region of light, the refined region of light is the region of light produced when shadowing and light attenuating objects are taken into account. It is preferable that the three dimensional region of light is determined as a refined three dimensional region of light as this is a more accurate reflection of the amount of light that is received by the specified area.

Typically determining the refined region of light comprises determining a second set of light attenuating objects and determining the surrounding context that includes one or more of the second set of light attenuating objects. The second set of light attenuating objects typically include surrounding building, vegetation or other objects that may attenuate light in the specified area. The geometry of the surrounding buildings, vegetation, or other objects that may attenuate light can be determined from the surrounding context if there is sufficient detail provided in the model. Otherwise the geometry of the surrounding context may be determined from third party data sources. Determining the geometry of the surrounding buildings enables an accurate calculation of the refined three dimensional region of light in the specified area.

Figure 9:
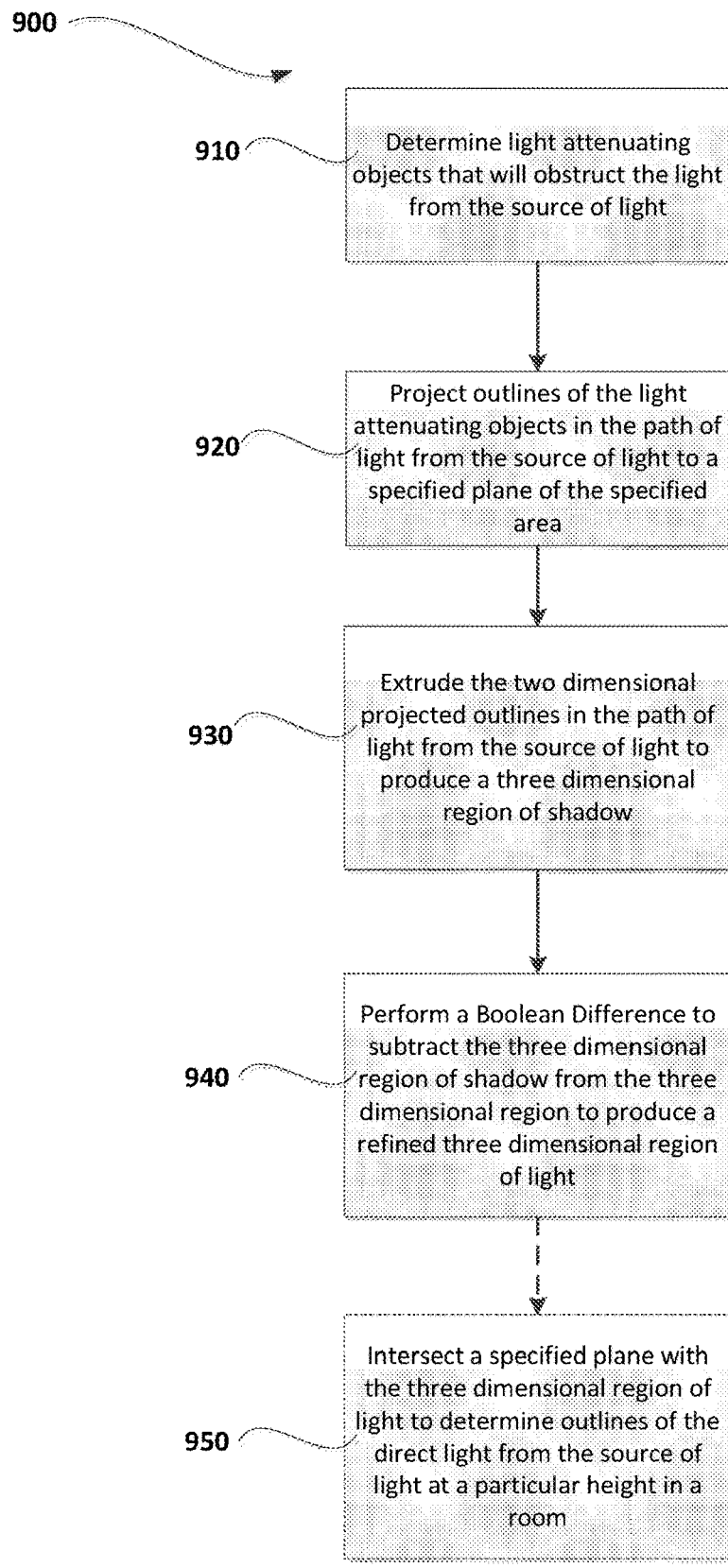
FIG. 9 illustrates an example method for determining a three dimensional refined region of light.

FIG. 9 is an example illustration of the method of determining a refined three dimensional region of light. The system first determines 910 light attenuating objects in a path of light from the source of light. It is preferable to include one or more shading elements if they affect or may affect the specified area. Shading elements are any elements that may provide shade when in operation. Shading elements may include fixed or operable devices that protect from sunlight such as roof overhang, eaves, awnings, pergolas, verandas, balconies, internal and external blinds, louvres, and adjustable roofs. They may be mounted within the specified area or even form part of the façade of the building. Where shading elements affect the specified area, the system may determine multiple regions of light for comparison to illustrate the effect of the shading elements. For example, the system may determine a region of light without fully extended blinds and with fully extended blinds to illustrate how effective the blinds may be.

Figure 10A:
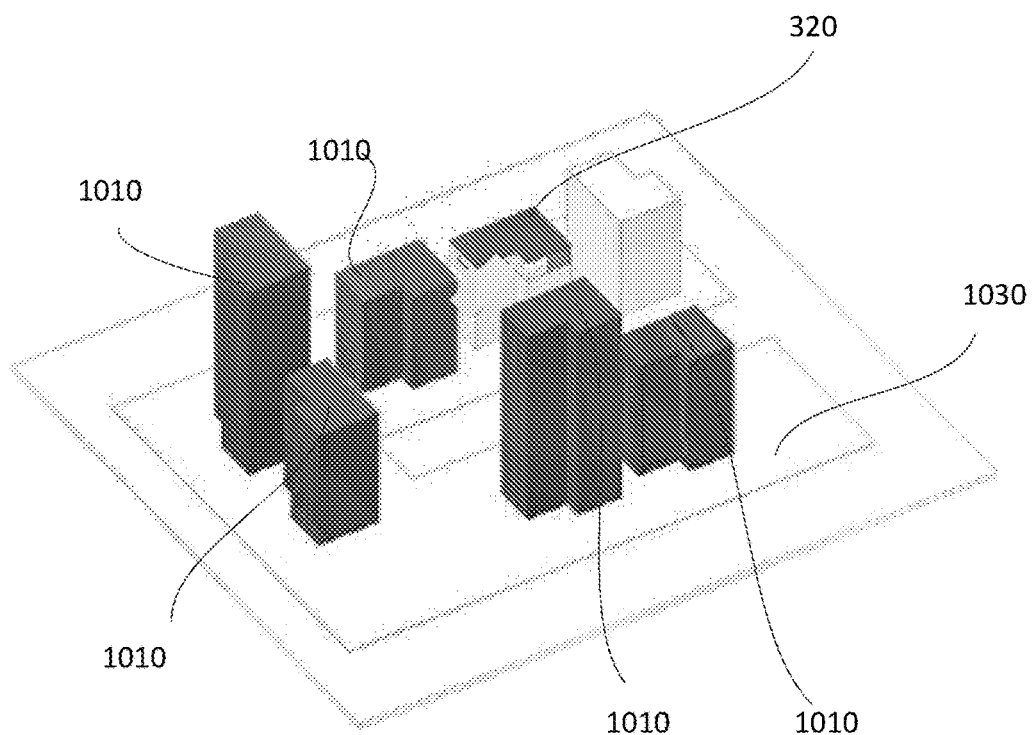
FIG. 10a illustrates an example application determining a three dimensional region of light that incorporates contextual light attenuating objects (such as nearby buildings).

The determination 910 of light attenuating objects in a path of light from the source of light may include all the light attenuating objects, or just the light attenuating objects in the context that are likely to affect the region of light. It may for example only be necessary to consider light attenuating objects within a few hundred metres of the specified area as most buildings would be under this height and therefore not project a shadow much beyond the height if measured on the ground. This may change depending on the light direction, for example, the sun may project long shadows in early morning or late afternoon. Even then the shadows in length are still likely to be less than twice the height of the building. As a result, it may simplify the refined light calculations to make some assumptions about those objects that are likely to affect the light, without substantially affecting the accuracy of the light calculations. FIG. 10*a* illustrates the light attenuating objects 1010 in the vicinity of the specified area 320, whereby the light attenuating objects 1010 are in a path of light from the source of light.

Figure 10B:
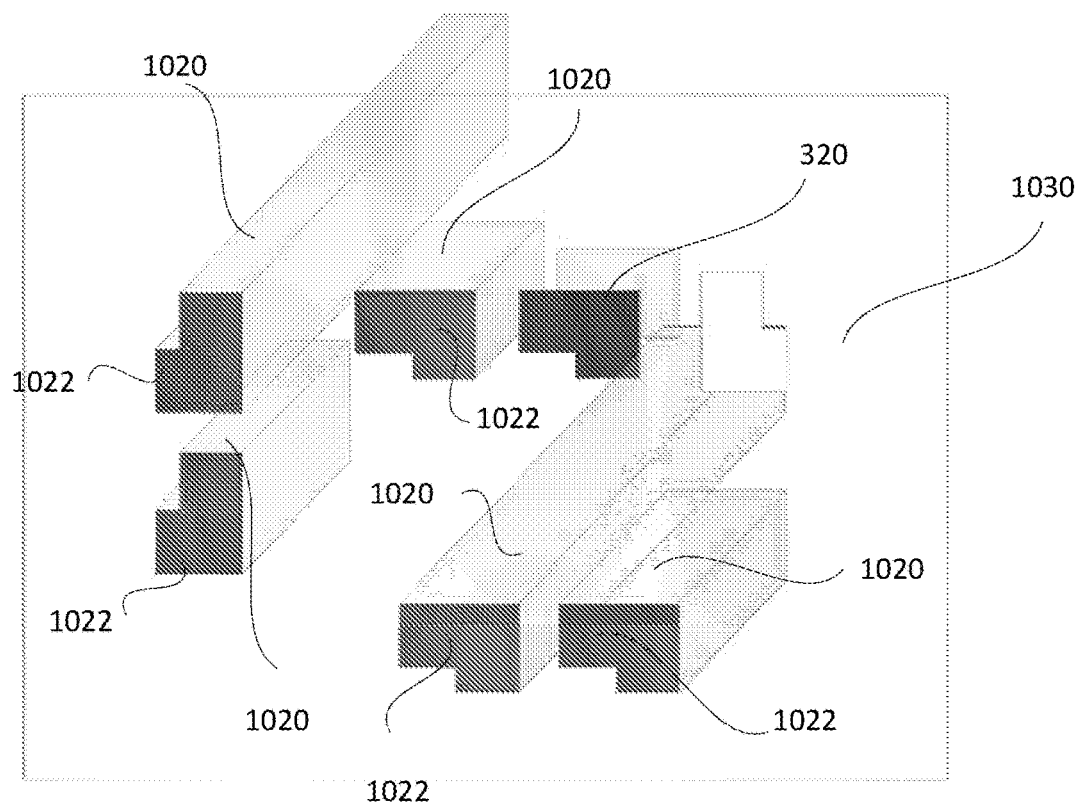
FIG. 10b illustrates the projected outlines of the light attenuating objects onto the floor plane of the specified area.

The system then projects 920 outlines 1022 of the light attenuating objects 1010 in the path of light from the source of light to a specified plane of the specified area. FIG. 10*b* illustrates the outlines of the light attenuating objects 1022 and the projected outlines 1020 of the light attenuating objects 1010 onto the floor plane 1030 of the specified area. Typically the specified plane would be a floor plane—that is a plane that is coextensive with the floor of the specified area in the model. However in some cases, the specified plane may be different from the floor plane and the user 110 may specify any plane that they may be interested in. For example, the plane that is parallel to the floor but one metre above the floor. This plane is useful because building regulations state that sunlight needs to be measured at 1 metre above the floor. Other planes may be vertical planes that may be used for indoor or outdoor vertical gardens or diagonal planes that may be used to position portable or fixed solar panels or other light receiving devices.

Figure 11A:
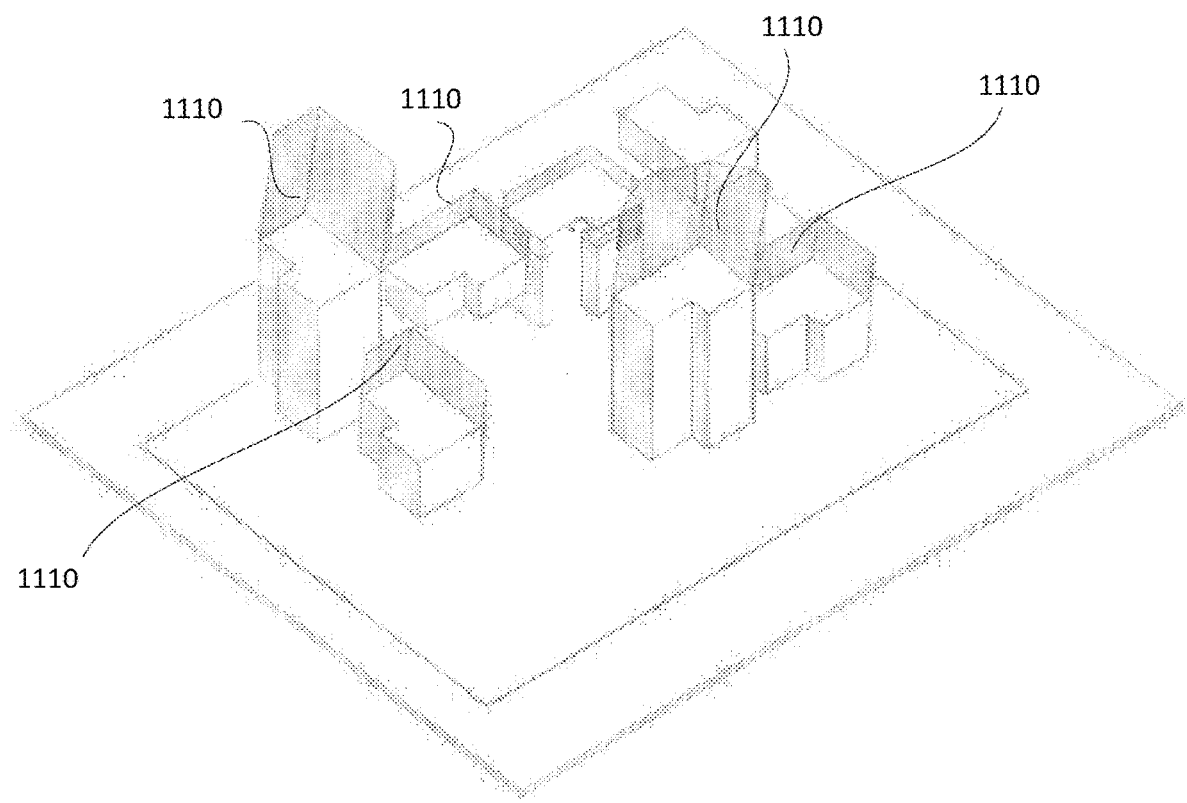
FIG. 11a illustrates the region of shadow cast by the example context such as buildings.

It is preferable that a refined region of light comprises determining a region of shadow in the specified area. The region of shadow may be formed by the context that includes massing, vegetation, shading elements or any other light attenuating objects. The region of shadow can be subtracted from the approximate region of light to determine the refined region of light. In this example, the system can then extrude 930 the two dimensional projected outlines 1020 in the path of light from the source of light to produce a three dimensional region of shadow 1110. FIG. 11a illustrates a three dimensional region of shadow 1110.

Figure 11B:
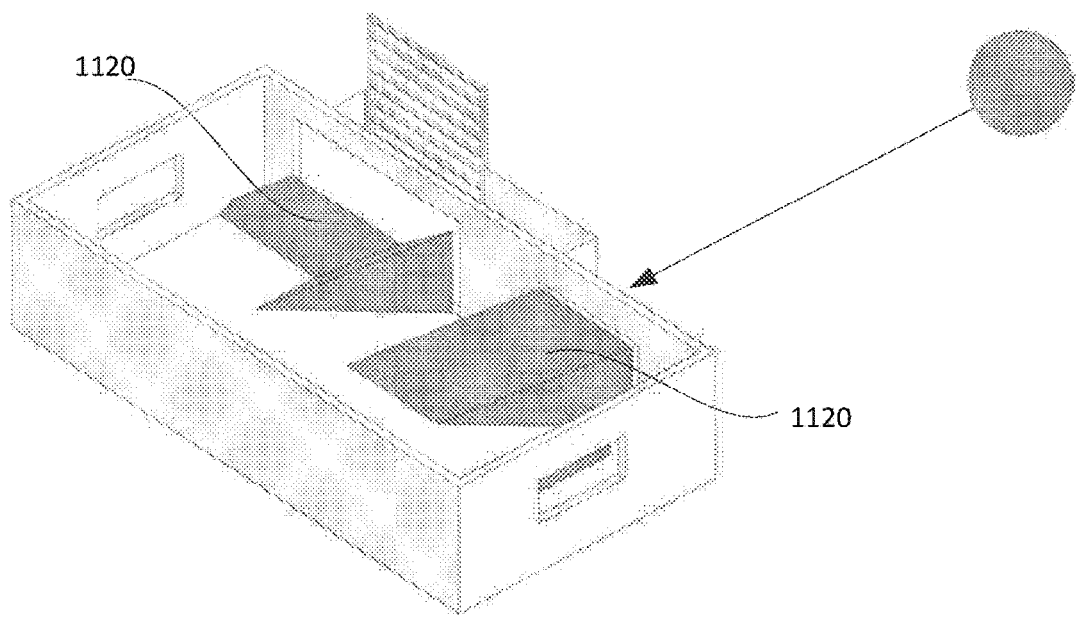
FIG. 11b illustrates an example three dimensional refined region of light after taking into account contextual light attenuating objects.

The system then performs 940 a Boolean Difference to subtract the three dimensional region of shadow 1110 from the approximate three dimensional region 820. Boolean difference is a command in AutoCAD and similar programs that geometrically subtracts one region from another. This produces a refined region of light 1120. FIG. 11b illustrates the three dimensional refined region of light 1120.

Specified Plane

Finally, a specified plane 450 can be intersected 950 with the refined region of light 1120. The specified plane 450 itself can then be visualised, or alternatively the specified plane can be used to calculate a proportion that intersects the region of light in the specified area. For example, a specified plane may be used to determine outlines of the direct light from the source or sources of light at a particular height in a room.

Determination by Room

The specified area may comprise of one or more rooms that correspond with one or more rooms in a two dimensional floor plan. The method may operate on the entire specified area or a part of the specified area. Relevant to most architectural application is the determination of the three dimensional region of light on a room by room basis.

Many three dimensional models known in the art do not include room information. As a result, they are unable to calculate light from a light source for each room. Most floor plans however would include room information. The floor plan may therefore be analysed to determine the location and size of each room relative to the specified area. Once the rooms have been determined, the region of light can be determined in one or more rooms. This may be useful where the amount of light received in each room is relevant to the user. For example, a resident of an apartment may not desire much sunlight during the late morning or early afternoon. However, during the same period the resident may wish the lounge room and recreational areas to have significant light exposure.

Figure 12:
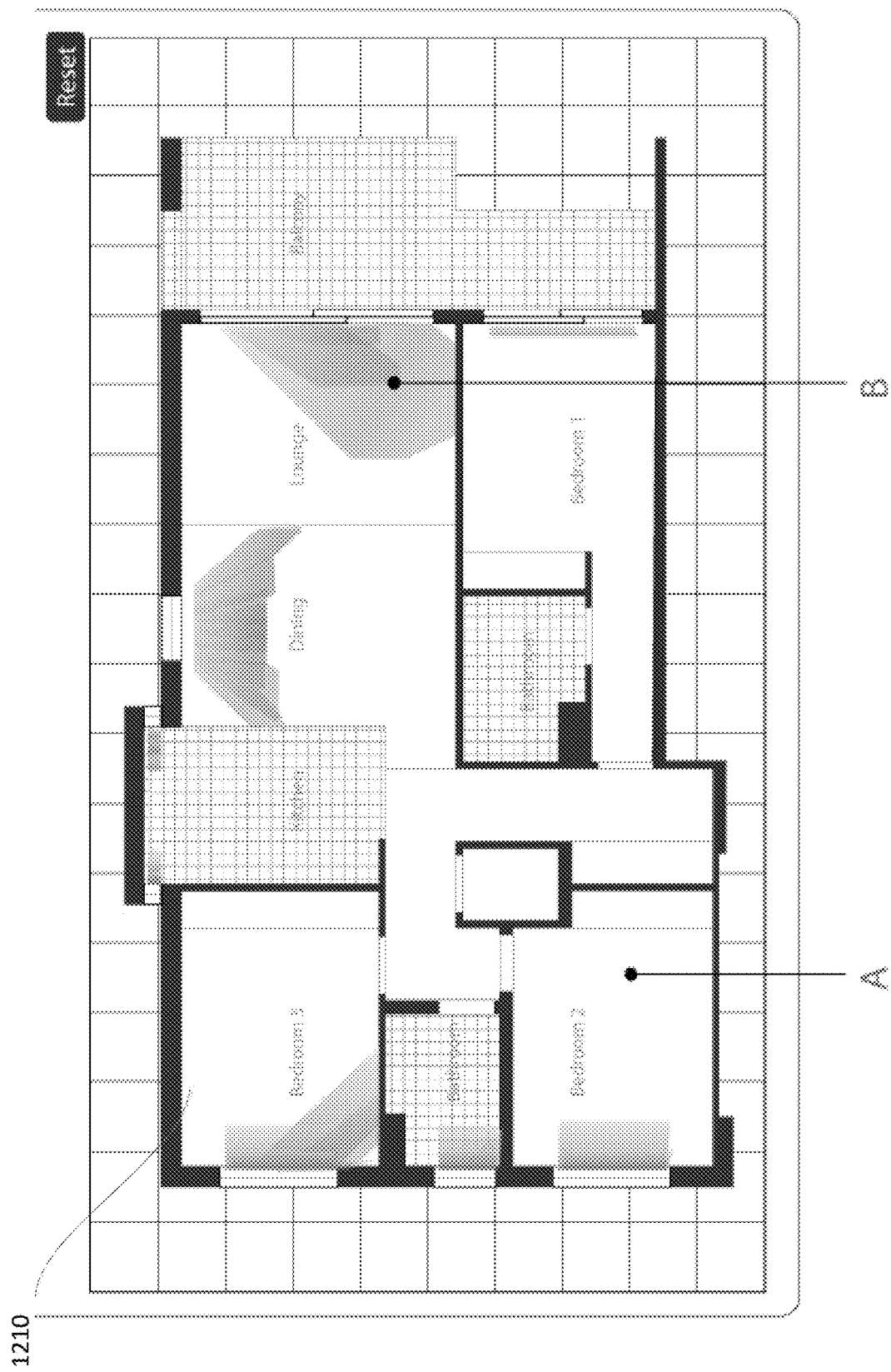
FIG. 12 illustrates an example specified plane that analyses the sunlight by room over a period of time

FIG. 12 shows an analysis of light on a two dimensional floor plan on a room by room basis. The light has been determined for one hour intervals for a specified location and date. The shading of the light indicates at what time the light is to be received—in this case, the lighter it is the earlier it is. Point A indicates a room (Bedroom 2) where there is no direct sunlight in the morning. Point B indicates a room (Lounge) where there are multiple overlapping regions of light in the morning.

Specified Area Analytics and Ranking

The specified plane 450 can be analysed according to metrics to provide a means for comparison between different specified areas. For example, if a proportion of the plane that intersects the region of light in the specified area is determined, it is possible then to determine a ranking of specified areas based on the proportion of the specified area that is formed by the region of light. FIG. 12 is an illustration of a specified plane 450.

As an example, according to the building regulations SEPP65 access to sunlight is measured at mid-winter (21 June) as this is the lower point of the sun in the sky year round. According to the regulations, a minimum of 1 metre squared of direct sunlight is required in each habitable room and achieved for at least 15 minutes, measured at 1 metre above floor level. This means that a useful specified plane for measuring the sunlight as required by the regulations can be determined by intersecting a plane parallel to the floor plane 460 of the specified area at 1 metre above the floor level to intersect with the region of light.

Figure 13:
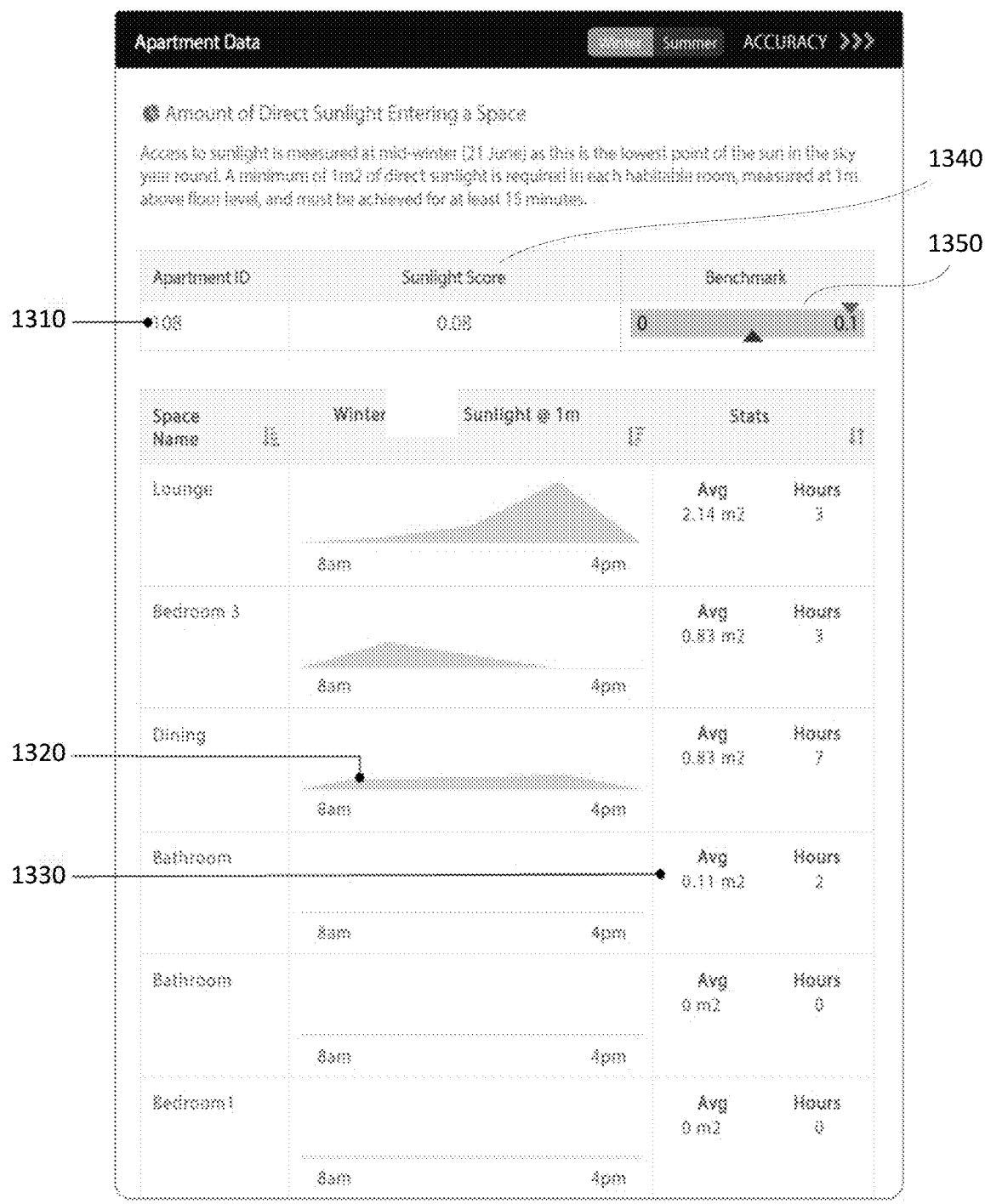
FIG. 13 illustrates example metrics for analysing and comparing the amount of sunlight on a specified plane over a period of time.

FIG. 13 is an example of multiple metrics that can be performed on the specified area 320. Each apartment in the data is given a specific identification number 1310. The apartment can be analysed by room to determine a proportion of the room that receives direct sunlight. For example, the row for Dining 1320 shows that the proportion of the dining room with direct sun increases only mildly from 8 am and then levels out and only increasingly slightly until approximately 3:30 pm. At this point the proportion of sunlight in the apartment tapers off until there is no direct sunlight at 4 pm. The statistics compiled for each room 1330 show the average amount of direct sunlight and the total number of hours for which the proportion of direct sunlight is greater than zero. Using these analytics, it is easy to see the rooms which comply with the regulations or alternatively with any other metrics which the user 110 may be interested.

The system can give the apartment a sunlight score 1340 based on a comparison of these metrics with other specified areas in the system. Further the system can benchmark the specified area against the score of other specified areas. In this example, the score of 0.08 is close to the maximum of 0.1 which places this apartment well above the average score for the apartments being considered for comparison.

Figure 14A:
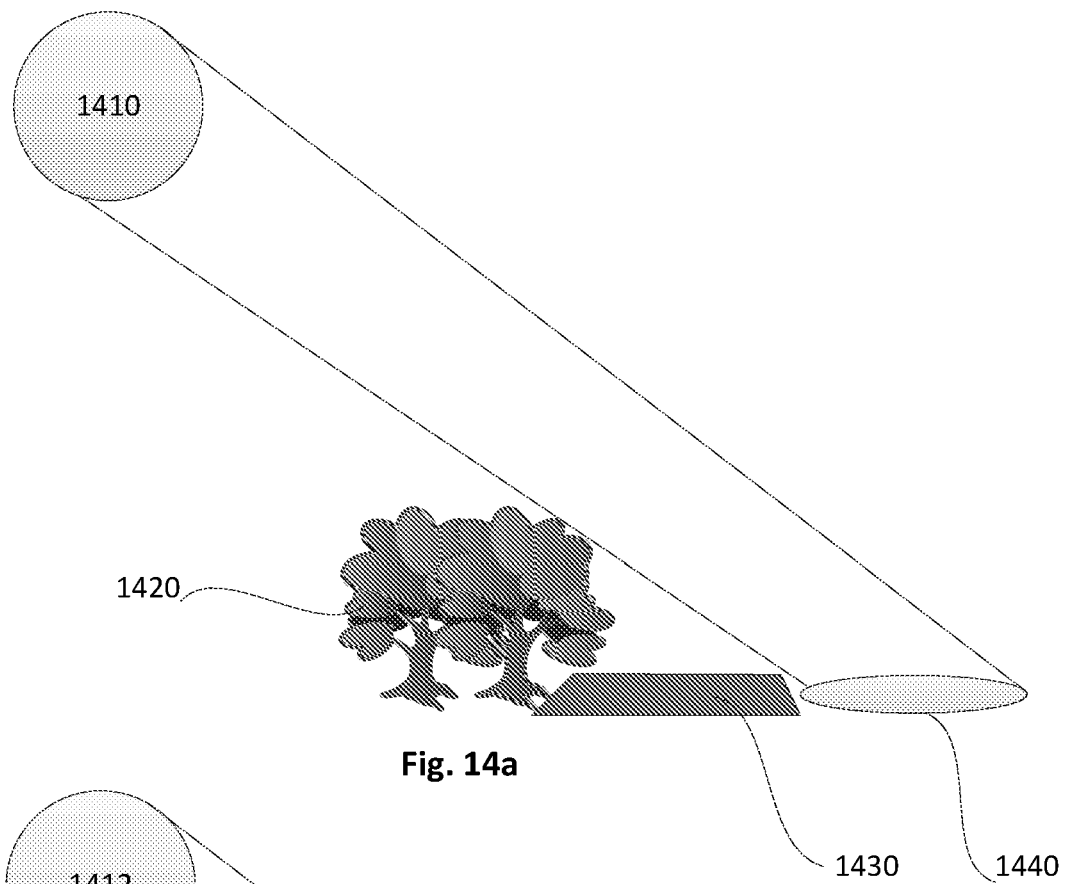
FIGS. 14a and 14b are simple illustrations to show similarities between shadowing effects caused by trees and buildings.
Figure 14B:
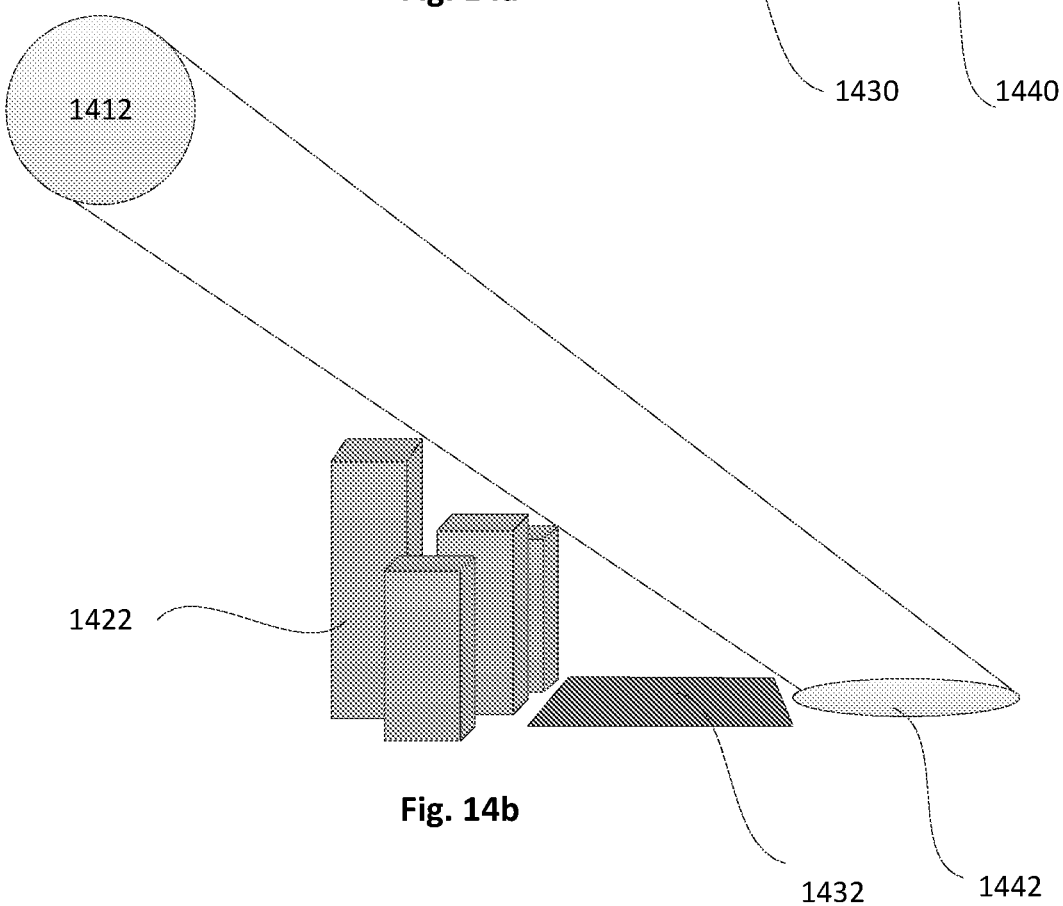

Although the specified area 320 in these examples is an apartment, the same principles apply for many different specified areas. FIG. 14a and FIG. 14b illustrate how the same principles as applied above could be utilised for parklands where trees (1420), vegetation or other objects attenuate light (FIG. 14a). In this case, the specified area may simply be an area on the ground with part of the specified area in shadow 1430 and part in direct light 1440. Similarly the same applies for public spaces in a city with multiple high rise buildings 1422 (FIG. 14b) where the buildings cause part of the specified area to be in shadow 1432 and part to be in direct light 1442. In addition, the specified area could be further above (or even below) the level of the ground if there were potential developments on the site of the specified area. A more detailed example is provided below.

Privacy

A variation on the above method for determining a region of light is determining a three dimensional region in a specified area visible from one or more view locations based on location information of the specified area, the one or more view locations and the one or more visibility attenuating objects in a path of light between the one or more view locations and the specified area.

Figure 15:
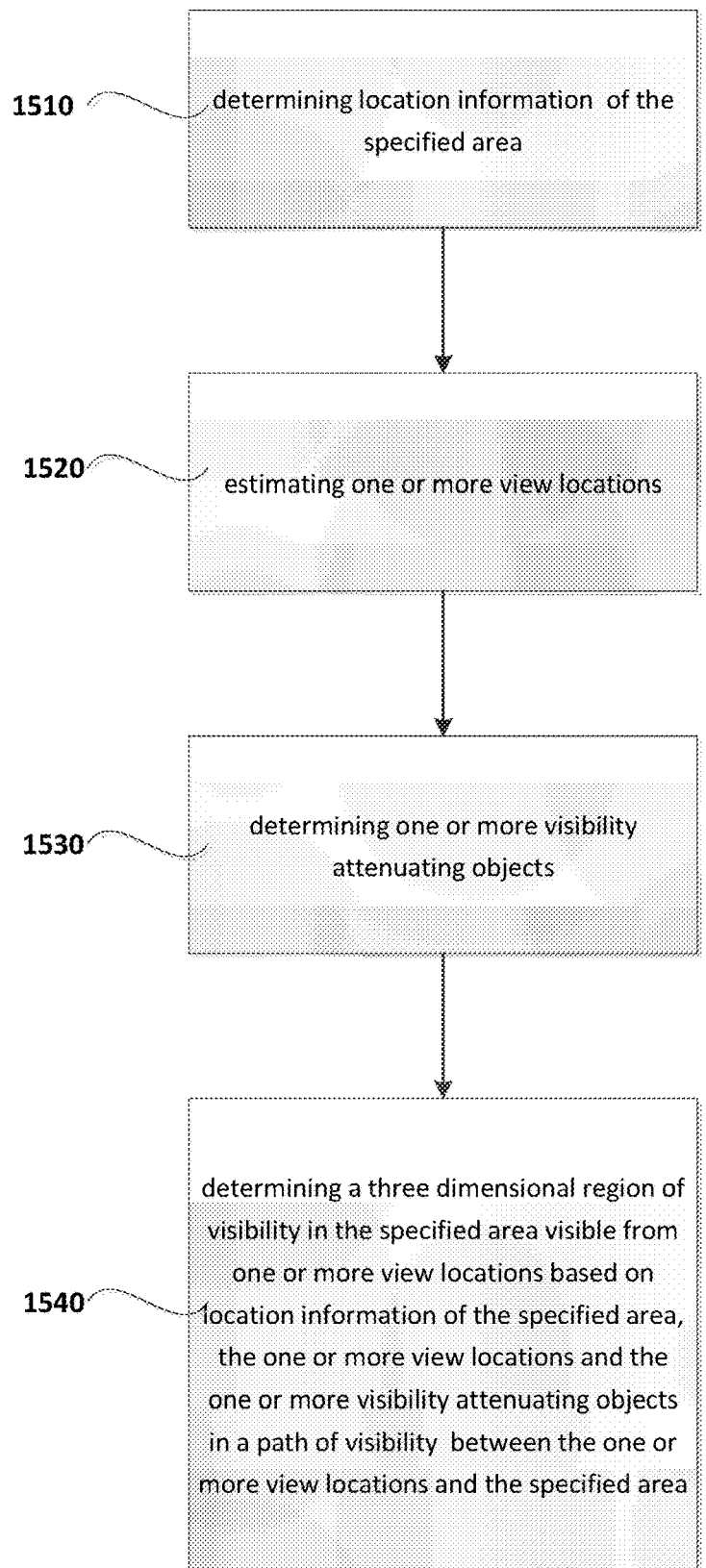
FIG. 15 illustrates a method for determining a three dimensional region of visibility

FIG. 15 is an example illustration of the method of a three dimensional region in a specified area visible from one or more view locations. First similarly to the above the system 120 determines 1510 the location information of the specified area. As in the example of FIG. 1, the location information may be the position of the apartment in the building and the orientation of the apartment. It does not need to be precise, although the more precise the location information is the more accurate the end result will be. For example, the system could utilise the latitude and longitude of the building to provide a very precise calculation. On the other hand, at a very basic level, the location information may simply be the relative position of the specified area in relation to the light source or even just a general locality, state or country in which the specified area is located.

Once the location information has been determined, the system can estimate 1520 one or more view locations. View locations can be estimated for example based on the windows and door openings of other buildings, apartments, houses and so on. View locations can also be people walking on the street, walkways, or other public or private spaces where the specified area may be visible.

The system then determines 1530 one or more visibility attenuating objects. Visibility attenuating objects are any objects that may affect the visibility of the specified area. Visibility attenuating objects may be similar to light attenuating objects such as the walls and any other structures. However, they may differ from light attenuating objects where the visibility attenuating objects are designed to reduce visibility without attenuating light. Examples of these types of objects are glass windows that are designed to transmit much of the light through the window from an internal view location but reflect the light from an external view location.

Then the system determines 1540 a three dimensional region of visibility in the specified area visible from one or more view locations based on location information of the specified area, the one or more view locations and the one or more visibility attenuating objects in a path of light between the one or more view locations and the specified area.

Figure 16:
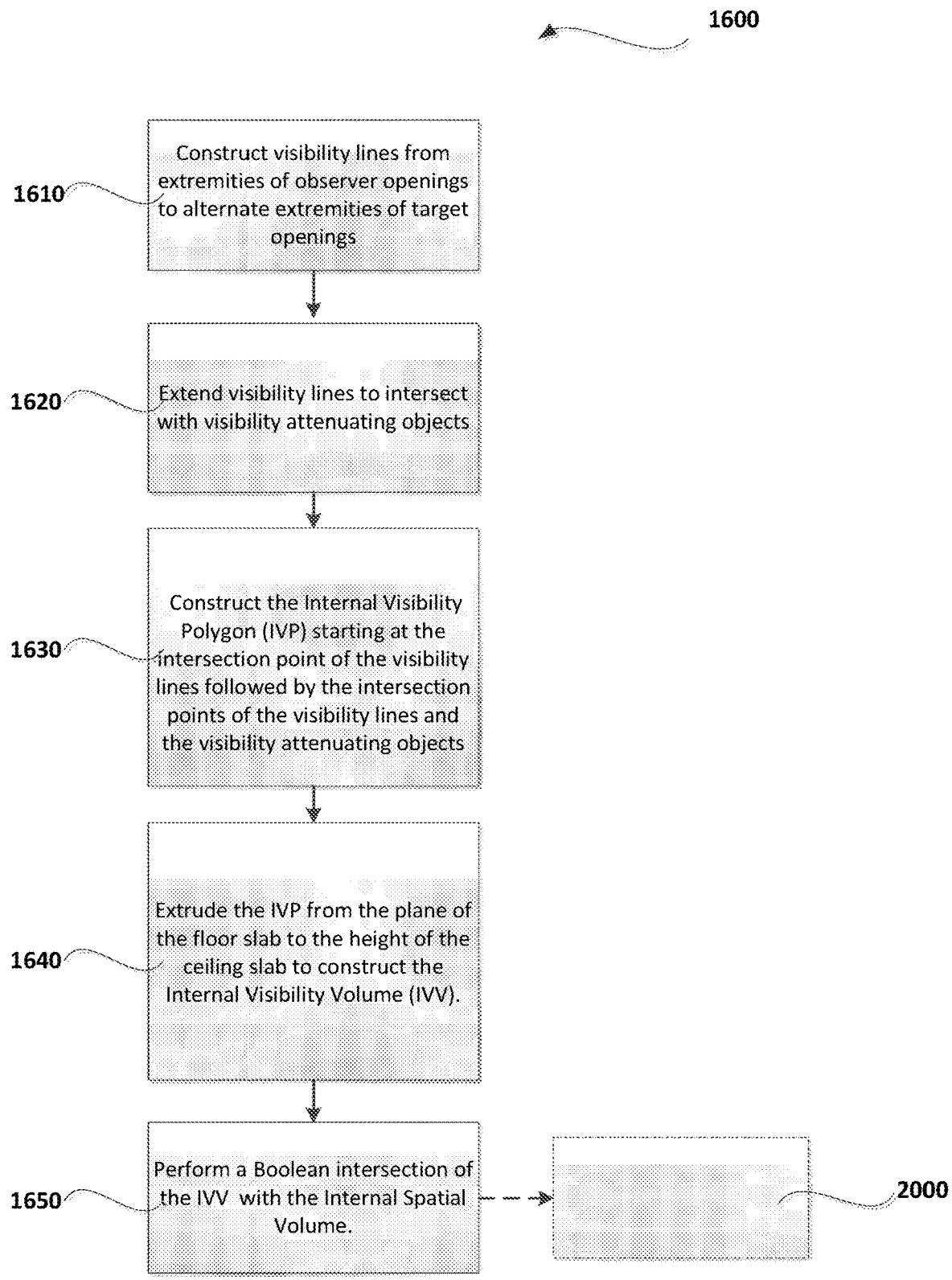
FIG. 16 illustrates a method for determining an approximate internal three dimensional region of visibility.

Determining the Three Dimensional Region of Visibility in a Specified Area Visible from One or More View Locations FIG. 16 is an example illustration of a method for determining 1540 a three dimensional region of visibility in the specified area visible from one or more view locations based on location information of the specified area, the one or more view locations and the one or more visibility attenuating objects in a path of light between the one or more view locations and the specified area.

Determining the three dimensional region of visibility in the specified area visible from one or more view locations based on location information of the specified area, the one or more view locations and the one or more visibility attenuating objects in a path of light between the one or more view locations and the specified area typically includes the following five steps:
1. Construct a three dimensional model
2. Determine approximate region of visibility
3. Determine gradings of visibility
4. Determine region of concealment
5. Determine refined region of visibility by subtracting region of concealment from approximate region of visibility Many of the principles described above apply in the determination of privacy as well and do not need to be repeated. The determination of the approximate region of visibility operates similarly to the approximate region of light. Determining the three dimensional region of visibility in the specified area may comprise determining the approximate region of visibility. An approximate region of visibility is the three dimensional region of visibility based on a first set of visibility attenuating objects formed by the objects associated with the specified area such as windows, doors and skylights. The approximate region of visibility may not take into account potential visibility attenuating effects caused by buildings or other structures.

Determine Approximate Region of Visibility

Figure 17A:
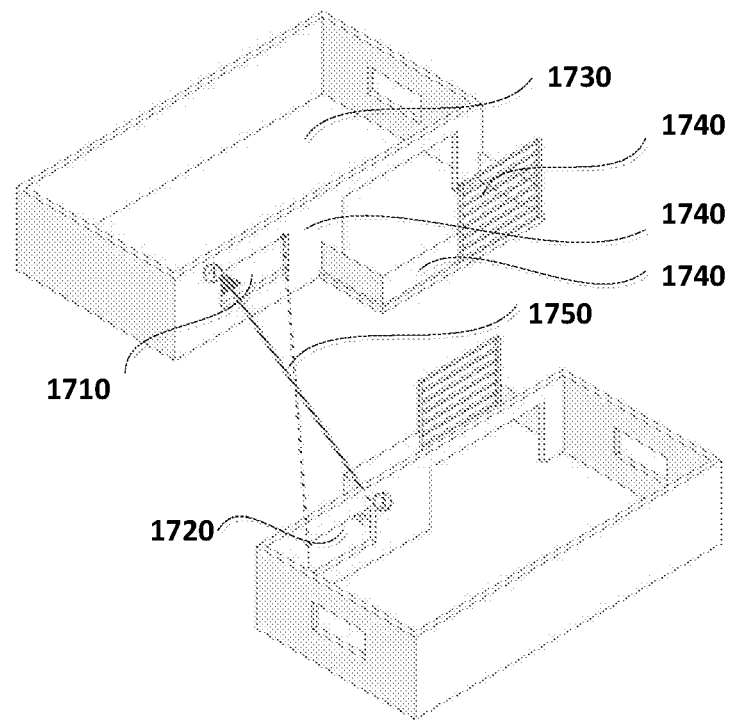
FIG. 17a illustrates an example of visibility lines from an observer location to a view location that represents the extent to which an observer in a view location of the observer apartment is able to see the specified area while positioned near the observer opening.

The first step involves constructing 1610 visibility lines from extremities of observer openings 1720 to alternate extremities of target openings 1710. In this example, the extremities of the observer openings are the upper left and upper right corners of a window in a similar apartment that is located on the same level as the specified area 1730, which in this case is an apartment. The alternate extremities of the target opening are the upper right and upper left corners of one of the windows in the apartment. The visibility lines 1750 represent the extent to which an observer in a view location of the observer apartment is able to see the specified area while positioned near the observer opening. An example of this is illustrated in FIG. 17a.

Figure 17B:
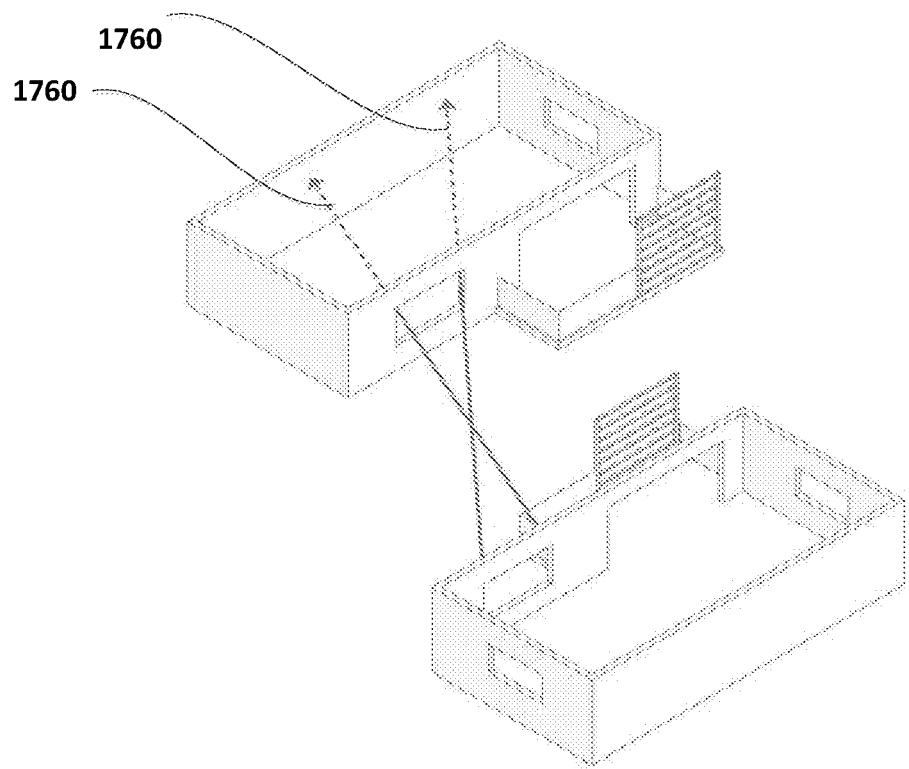
FIG. 17b illustrates an example of the visibility lines being extended into the specified area.

The system extends 1620 the visibility lines to intersect with visibility attenuating objects. In this example, the visibility lines 1760 have been extended through the specified area to the walls furthest from the observer. FIG. 17b illustrates the visibility lines being extended into the specified area 1730.

Figure 18A:
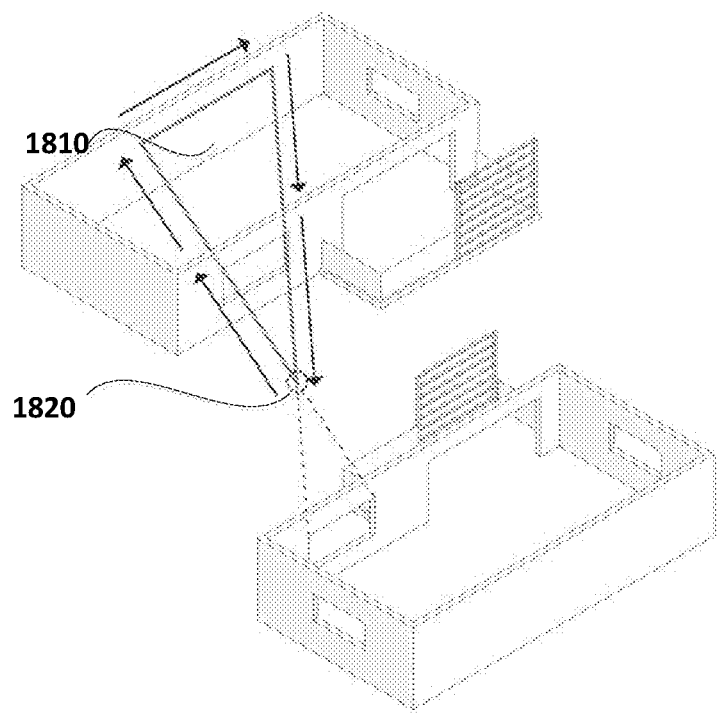
FIG. 18a illustrates an example of the internal visibility polygon (IVP).

Then the system constructs 1630 the Internal Visibility Polygon (IVP) 1810 starting at the intersection point 1820 of the visibility lines followed by the intersection points of the visibility lines and the visibility attenuating objects. FIG. 18a illustrates how the Internal Visibility Polygon 1810 is constructed.

Figure 18B:
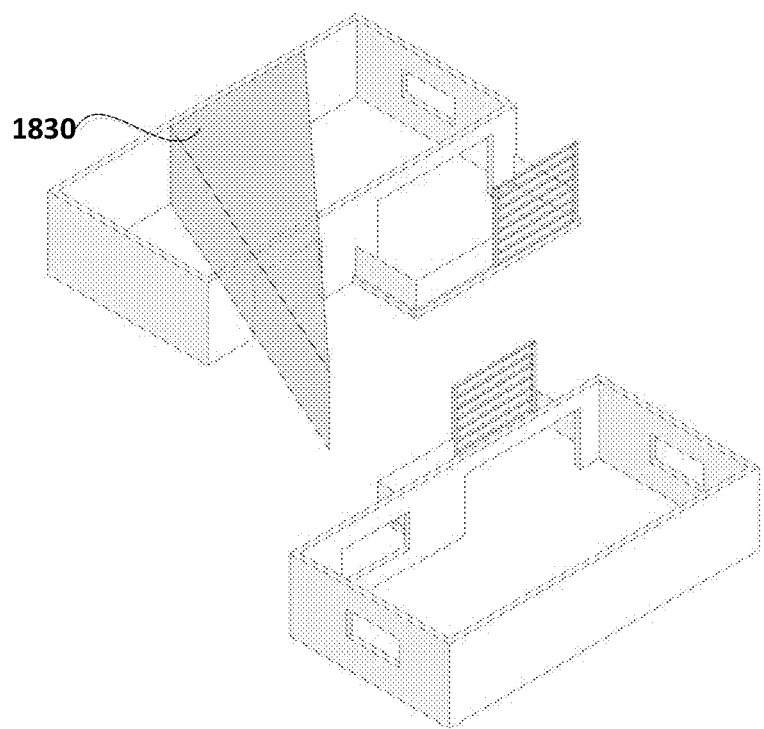
FIG. 18b illustrates an example of the internal visibility volume (IVV).

Once the IVP has been constructed, in this example the system extrudes 1640 the IVP from the plane of the floor slab to the height of the ceiling slab to construct the Internal Visibility Volume (IVV) 1830. FIG. 18b illustrates how the Internal Visibility Volume 1830 is constructed.

Figure 19:
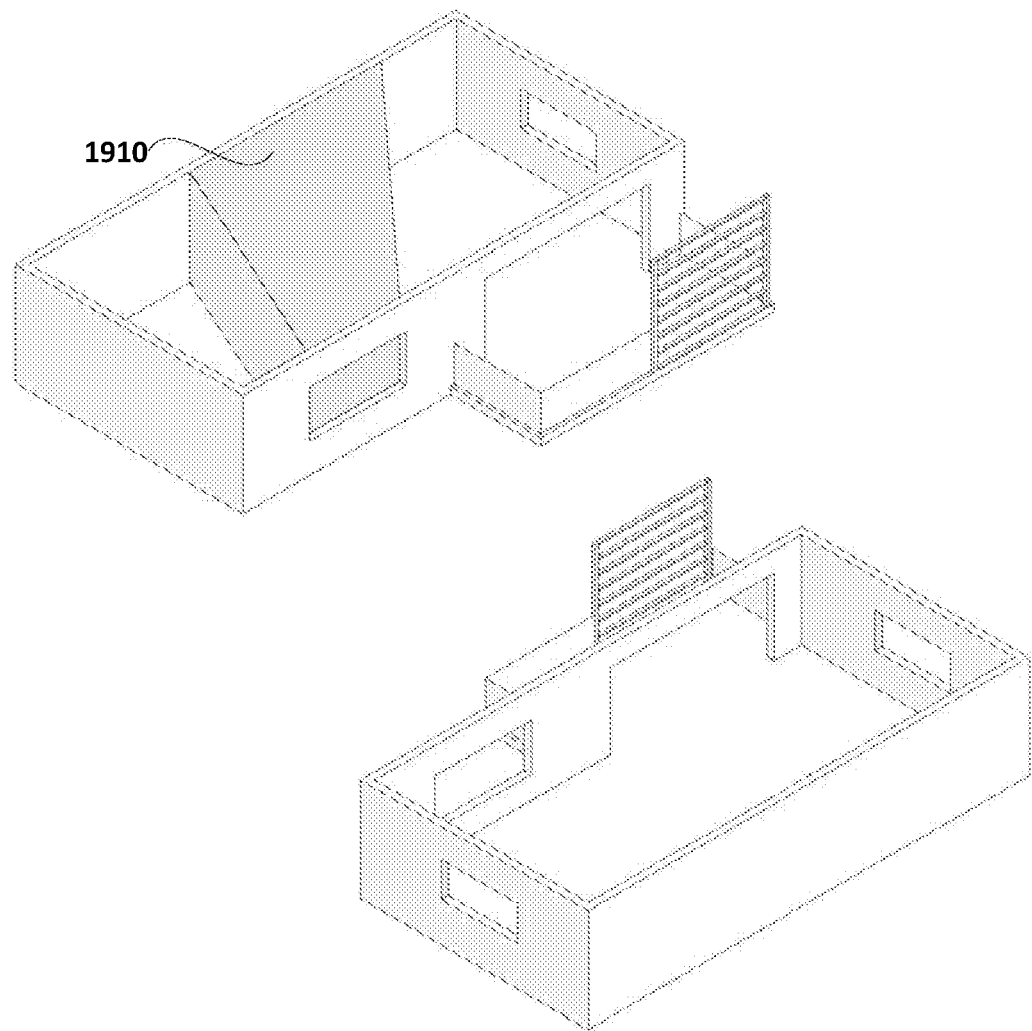
FIG. 19 illustrates an example of the IVV intersected with the internal volume of the specified area.
Figure 20:
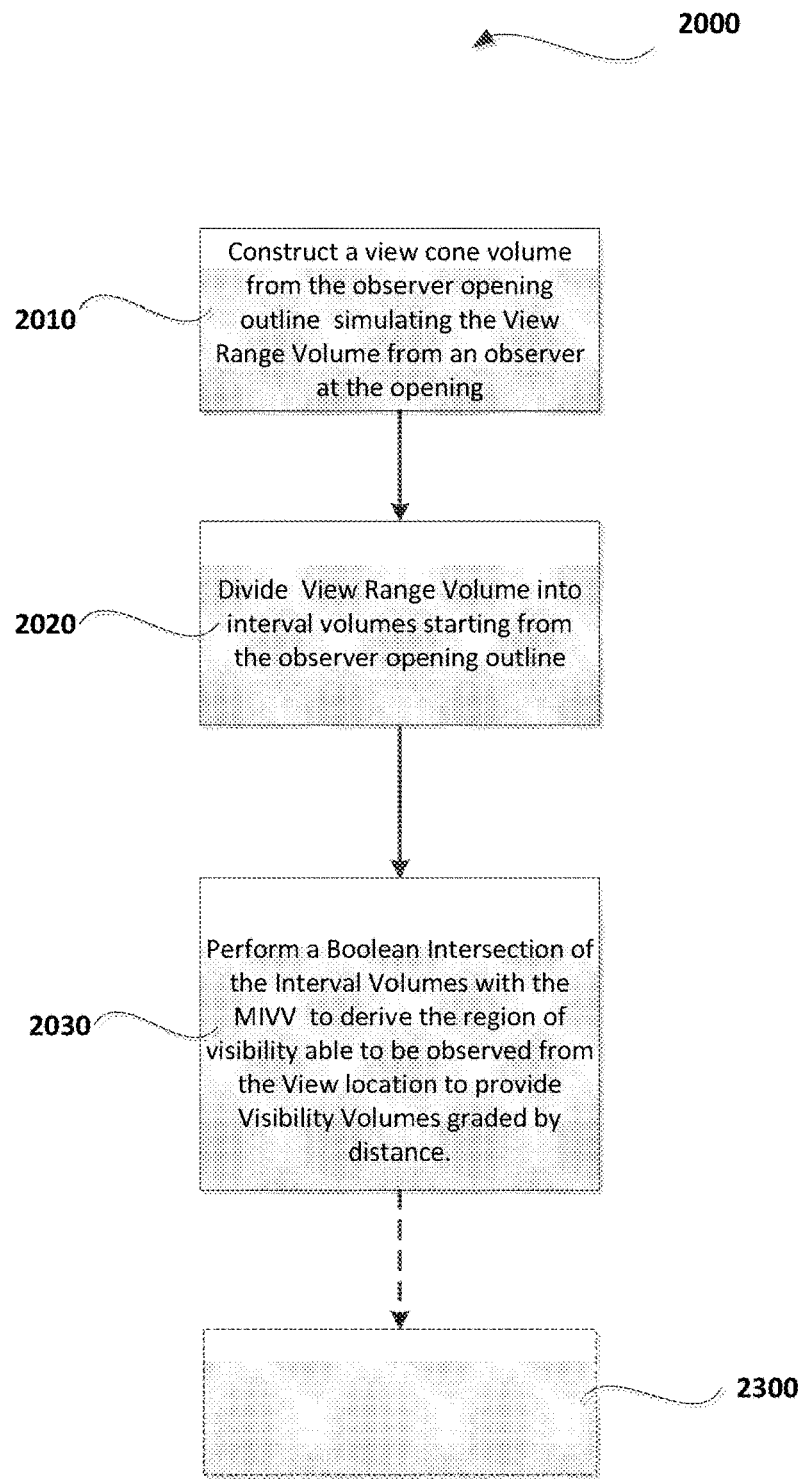
FIG. 20 illustrates a computer implemented method for determining a three dimensional region of visibility graded by distance.

Then the system can perform 1650 a boolean intersection of the IVV 1830 with the internal volume of the specified area. This three dimensional region represents the Approximate Region of Visibility 1910 in the specified area as shown in FIG. 19. The Approximate Region of Visibility 1910 represents the approximate amount of the specified area that can be seen from an observer in the view location that is the observer apartment situated near the observer window 1720.

Determine Gradings of Visibility

Figure 21A:
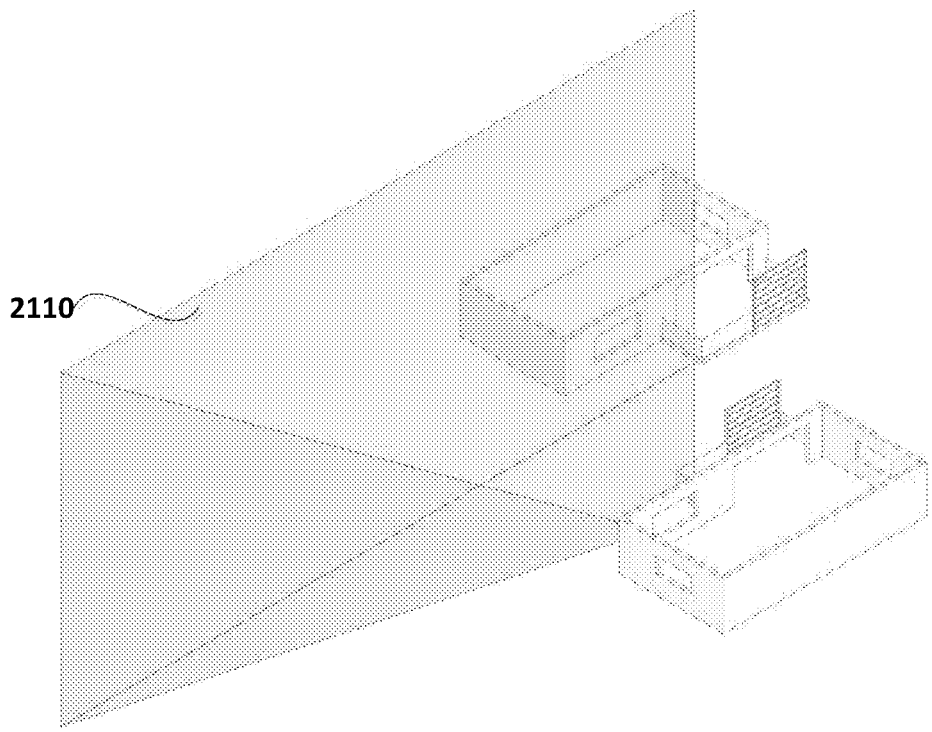
FIG. 21a illustrates an example View Range Volume (VRV).

The first step involves constructing 2010 a view cone volume from the observer opening outline simulating the View Range Volume from an observer at the observer window 1720. The angle of the view cone is fixed in this example but may be changed such that it is estimated based on the observer's minimum distance from the external outline of the observer 1720. In such a case, the minimum distance is the wall thickness so the angle of the view cone would remain quite wide. FIG. 21a illustrates the View Range Volume (VRV) 2110.

Figure 21B:
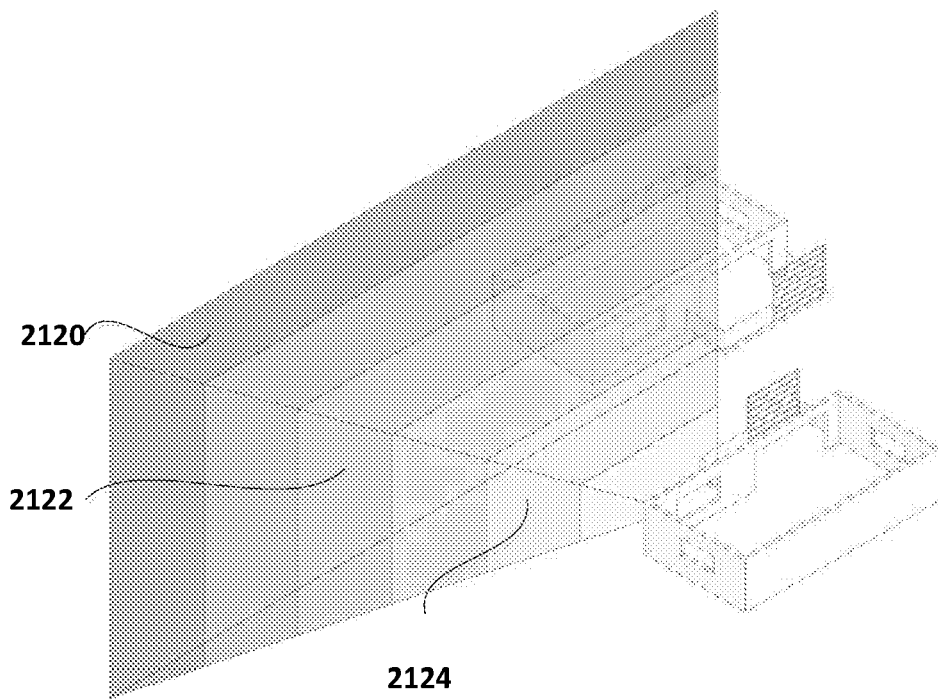
FIG. 21b illustrates an example View Range Volume graded by a distance of 3 metres

A further step involves dividing View Range Volume into interval volumes starting from the observer opening outline. In this case the interval volumes are calculated at 3 metres intervals as measured in a straight line from the observer window 1620. FIG. 21*b* illustrates the interval volumes 2120, 2122 and 2124. Interval volume 2124 begins at a distance of 3 metres from the observer window 1620 and ends at a distance of 6 metres from the observer window 1620. Interval volume 2122 begins at a distance of 12 metres from the observer window 1620 and ends at a distance of 15 metres from the observer window 1620. Interval volume 2120 begins at a distance of 18 metres from the observer window 1620 and ends at a distance of 21 metres from the observer window 1620. In this example, the shading of each interval volume is darker as the distance increases from observer window. Alternatively any indicia such as colour or patterns may be used to indicate the distance from observer window to the user 112.

Figure 22A:
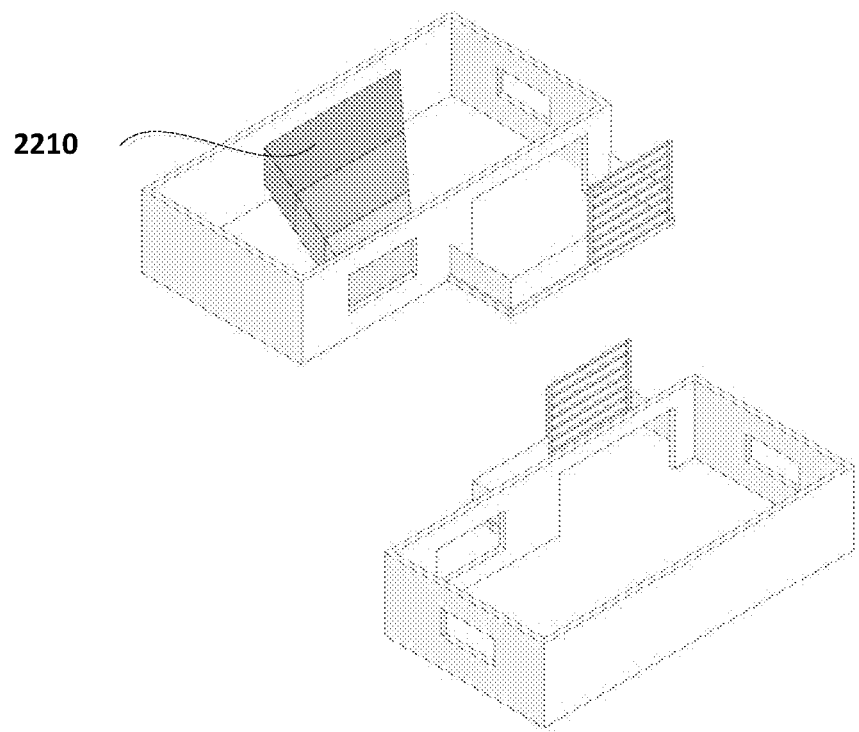
FIG. 22a illustrates an example View Range Volume intersected with the internal volume of the specified area.

The system can then perform 1930 a Boolean Intersection of the Interval Volumes with the IVV to derive the region of visibility able to be observed from the view location to provide the region of visibility graded by distance. FIG. 22*a* illustrates the three dimensional region of visibility 2210 in the specified area graded by distance.

Figure 22B:
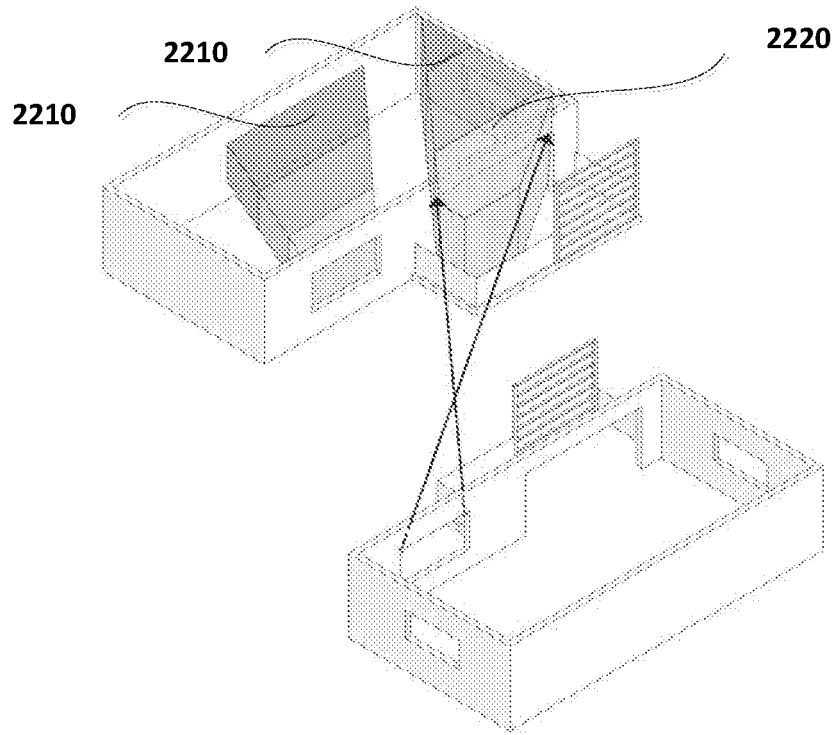

The system can then perform the above steps for each of the target openings, and for further observer openings. FIG. 22*b* illustrates the same method as above as applied to a further opening in the specified area to produce a second three dimensional region of visibility 2220. The three dimensional region of visibility 2210 may be the aggregation of the three dimensional regions of visibility produced by all the observer openings.

Determine Region of Concealment

Figure 23:
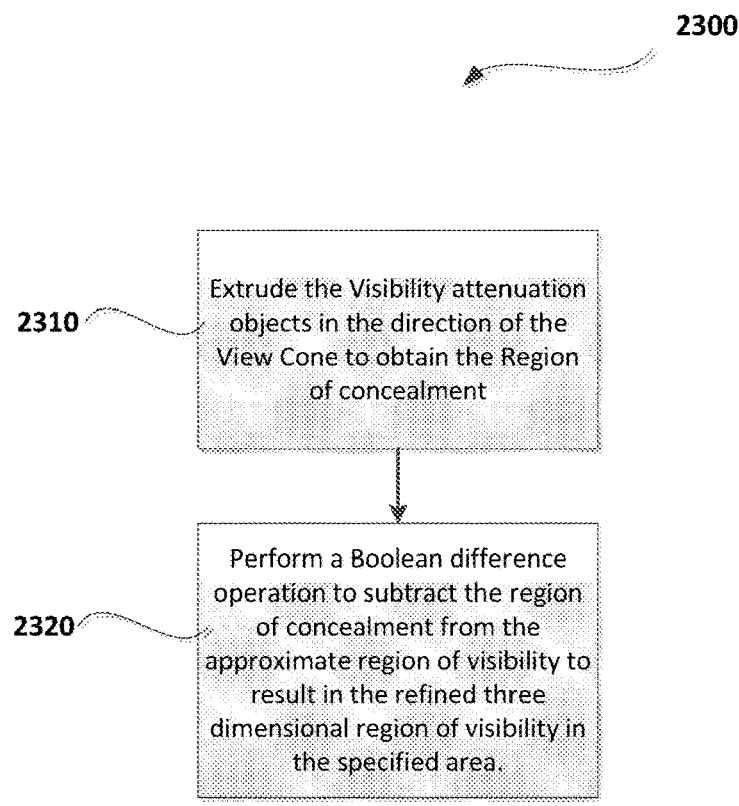
FIG. 23 illustrates a computer implemented method for determining an approximate region of visibility in a specified area.
Figure 24A:
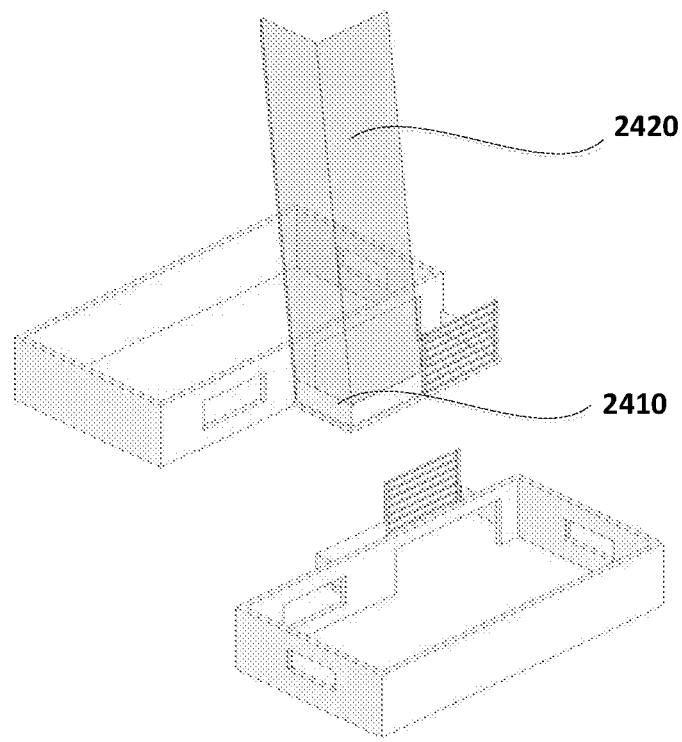
FIG. 24a illustrates an example of a three dimensional region of concealment produced by a visibility attenuating object.

FIG. 23 is an example illustration of the method 2300 of determining a refined three dimensional region of visibility in the specified area. Much like the step relating to determining the region of light above, the visibility attenuating objects are extruded 2310 in the direction of the view cone to obtain the region of concealment 2420. FIG. 24*a* illustrates the visibility attenuating objects 2410 extruded in the direction of the view cone. In this example, balcony wall 2410 is attenuating a lower portion of the visibility region which forms the region of concealment 2420.

Figure 24B:
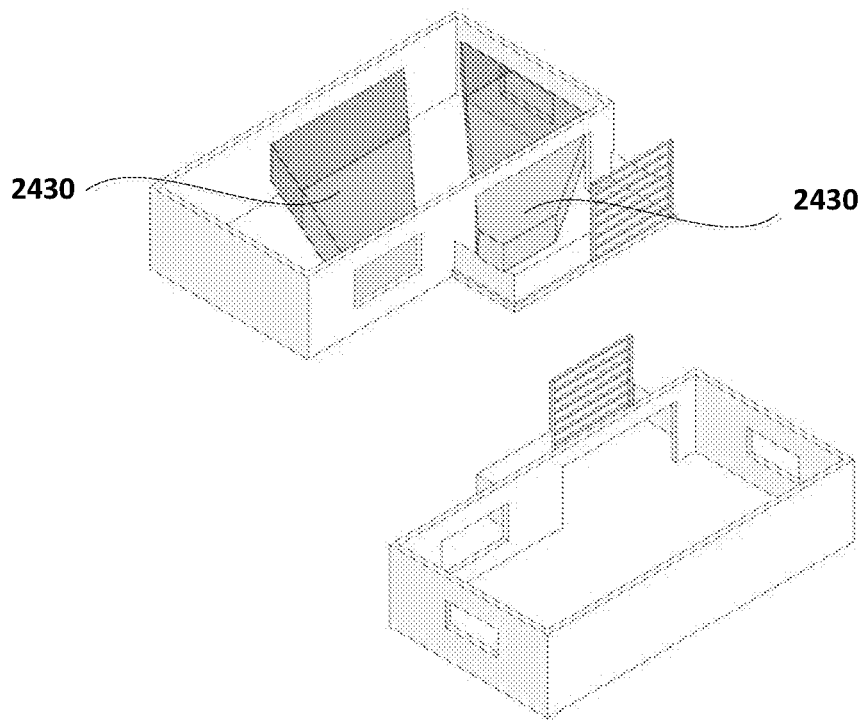

Determine Refined Region of Visibility by Subtracting Region of Concealment from Approximate Region of Visibility Finally the system can perform 2320 a Boolean difference operation to subtract the region of concealment 2420 from the approximate region of visibility to result in the refined region of visibility in the specified area. This represents an accurate region of visibility that takes into account any obstacles or other visibility attenuating objects. FIG. 24*b* is an illustration of the refined region of visibility 2430.

Further Details

Visualising the Three Dimensional Region of Light or Visibility

The above description and the figures describe how the three dimensional region of light or visibility can be visualised. In many of the examples, the three dimensional region of light or visibility can be represented as a solid, where a solid is a three dimensional geometric object. This allows for more simply visualising light or visibility and assists in enabling an intuitive calculation of the volume of this shape by the user. However, the three dimensional region may not necessarily be a solid shape, and may be a collection of faces, points or lines that define a three dimensional region (such as the vertices of a rectangular prism). When representing the three dimensional region of light, the collection of faces, points or lines may be overlayed over the three dimensional representation of the specified area to illustrate how the specified area is affected by light or visibility.

Specified Area

The term specified area as used in this disclosure may be referring to any area or finite space where a measurement of light or visibility is useful. For example, a specified area could be an architectural space such as an apartment, house or other structure. Other suitable specified areas include gardens, parklands, undeveloped and underdeveloped urban areas or any other space where it may be useful to determine a three dimensional region of light or visibility.

Figure 25:
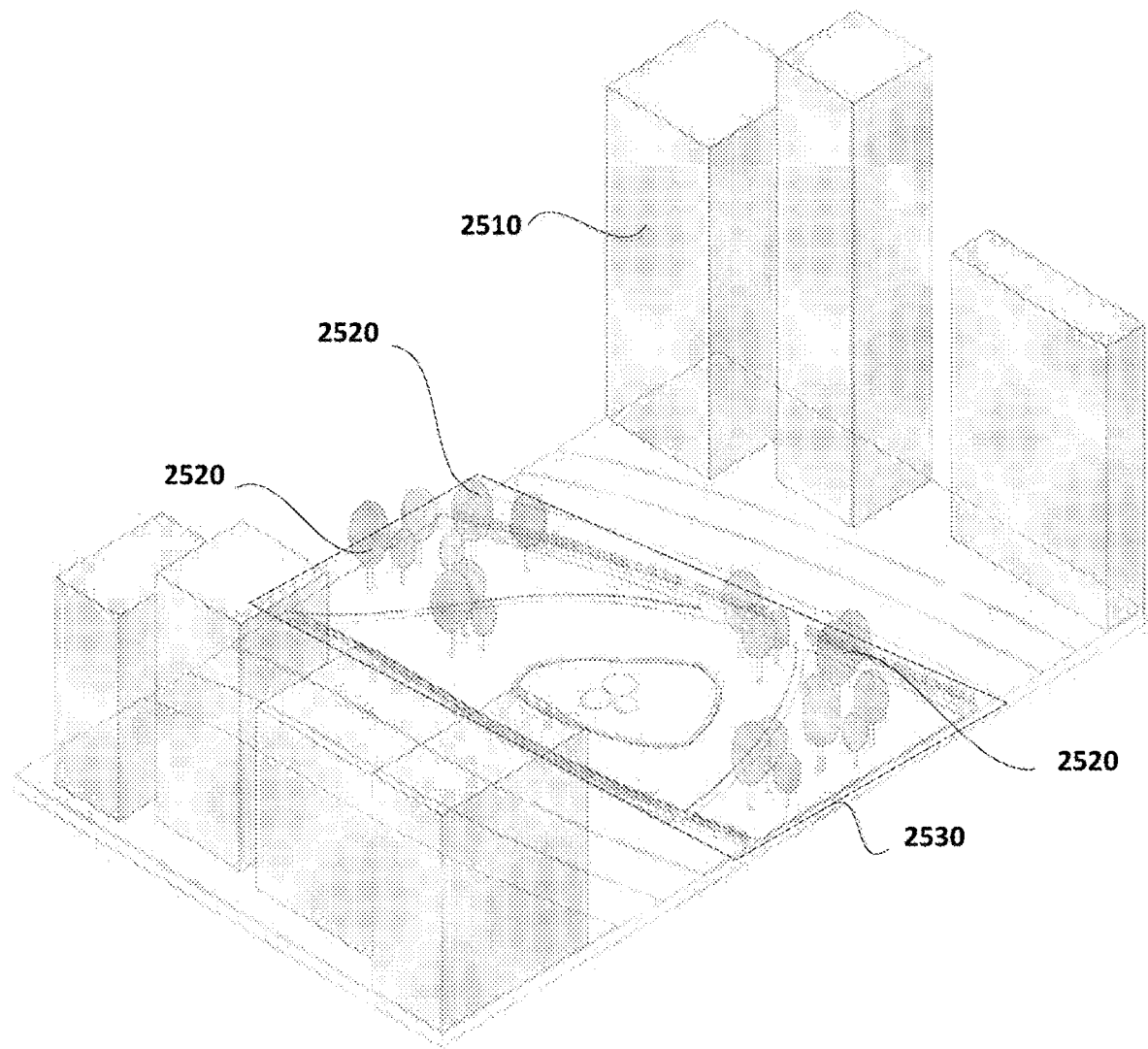
FIG. 25 illustrates an example application to parklands surrounded by a city.

To illustrate how the specified area may be more than just a building, apartment or other built area, FIG. 25 shows an example application of the method to parklands 2530 containing trees 2520 surrounded by buildings 2510. In this example, the buildings 2510 are providing shadows on the parklands when the buildings are in a path of light between the parklands 2530 and the sun. The trees 2520 also provided shadows on the parklands as well.

To provide a more accurate region of light, the buildings 2510 and trees 2520 should be modelled as close to their real geometry as possible. But where no model information exists a simple bounding box can used to illustrate how the shadows affect the sunlight. A bounding box provides an estimation of the shadowing effect. In order to provide a good approximation, the bounding box may be positioned at the extremities of the known or estimated geometry of the trees or building. It may also be positioned where it is able to generate the likely shadowing effects produced by a tree or building or other light attenuating object. One or more bounding boxes may be used for more complex objects.

In the example in FIG. 25, the trees 2520 have been calculated simply as bounding boxes. This could be made more accurate if the trees were modelled using the actual geometry of the trees. There are numerous methods to establish the actual geometry of light attenuating objects such as with a three dimensional scanner or by utilising two dimensional photographs to calculate the geometry.

Figure 26:
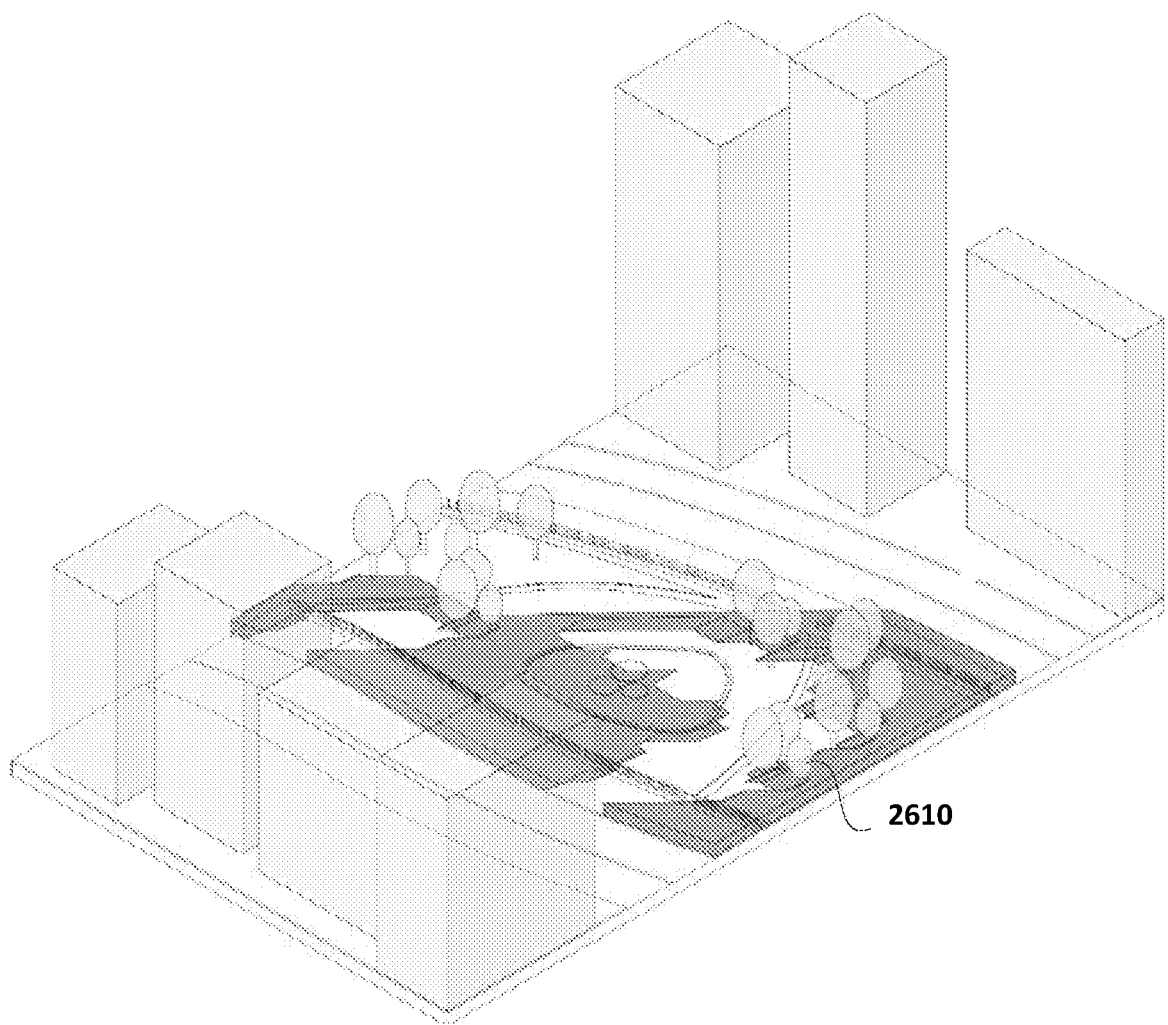
FIG. 26 illustrates an example three dimensional region of light produced by the sun up to a level of 2.8 m above the ground.

FIG. 26 shows an example application of the method to parklands for determining a three dimensional region of light 2610 in a specified area 2530 that receives light from one or more sources of light. In FIG. 26, the height of the three dimensional region of light is 2.7 metres as this is the typical floor to ceiling height. It also represents the an upper bound for the height of most people standing on the ground in the parklands.

Figure 27:
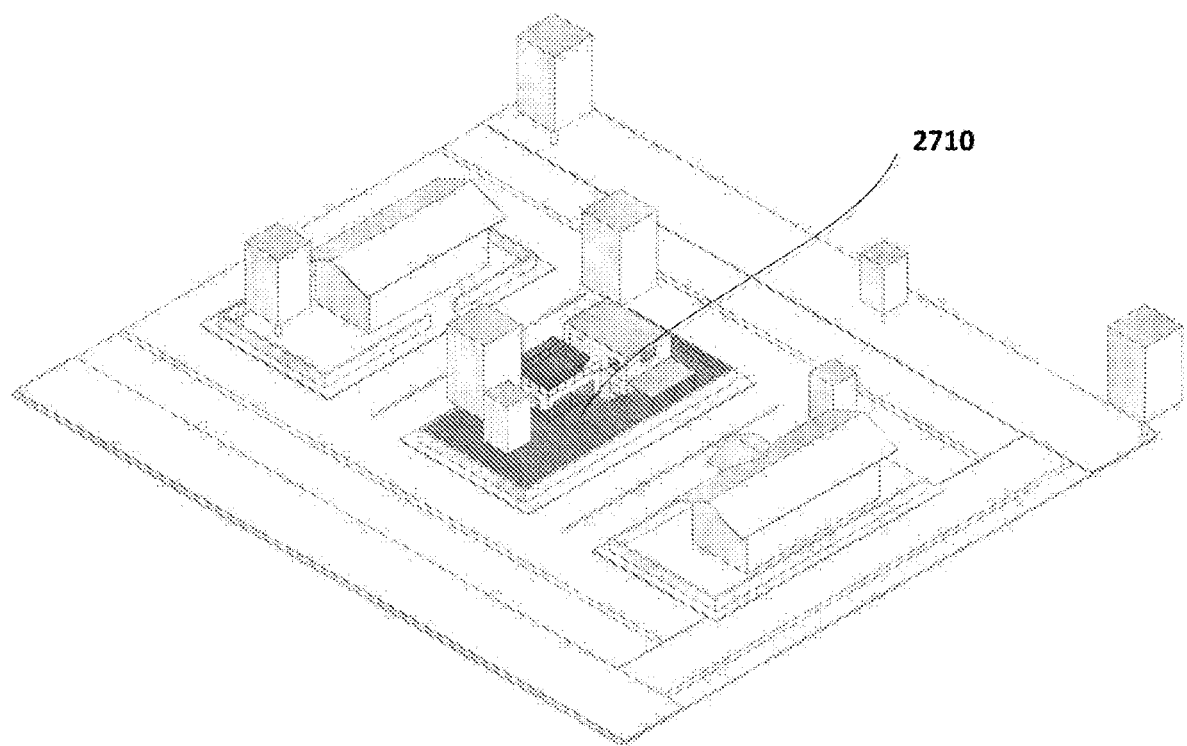
FIG. 27 illustrates an example three dimensional region of light on a property containing a house, showing internal and external three dimensional regions of light.

FIG. 27 shows an example application of the method for determining a three dimensional region of light 2710 in a property containing a house that receives light from one or more sources of light. This example shows the determination of a three dimensional region that includes both internal and external areas of the property.

Sources of Light

The method works with any type of light source including any natural or artificial processes that emit light. Artificial light sources include incandescent light bulbs, halogen lamps, fluorescent tubes, neon light, Light-Emitting Diodes (LED), (Active-Matrix Organic Light-Emitting Diode) AMOLED, and laser. Examples of natural light sources include the sun, the moon, and electric discharge.

The simplest form of light source is a single directional light source—that is, where all the light from a light source comes in substantially one direction. The best example of such a light source is the sun although the moon also reflects a directional source of light. Many point light sources also produce directed light and produce strong shadows although some point light sources are omnidirectional. Lamps for example tend to be omnidirectional.

Another example of light sources are diffuse light sources. Diffuse light sources are those that produce light in multiple directions but do not typically produce much shadow. They typically are a form of artificial lighting. These artificial lights typically emit light over an area rather than a single point such as illuminated ceilings and walls.

The shape of the light that comes from a non-directional light source is referred to as a spread. The spread is essentially a beam angle and a field angle. Beam angle refers to the angle between the two planes of light where the intensity is at least 50% of the maximum intensity at centre beam. Field angle refers to the angle between the two planes of light where the intensity is 10% (or less) of the maximum intensity at centre beam.

Many artificial light manufacturers describe the type of light source and its spread in documentation or provide models in CAD files or similar. Where the spread of a light source is provided by the manufacturer, the spread of the light source can be incorporated into the determination of the three dimensional region of light to make it more accurate. If the spread of a light source is not known, the user 110 or system 120 may estimate a spread based on the type of light source or likely type of light source to be used.

Figure 28:
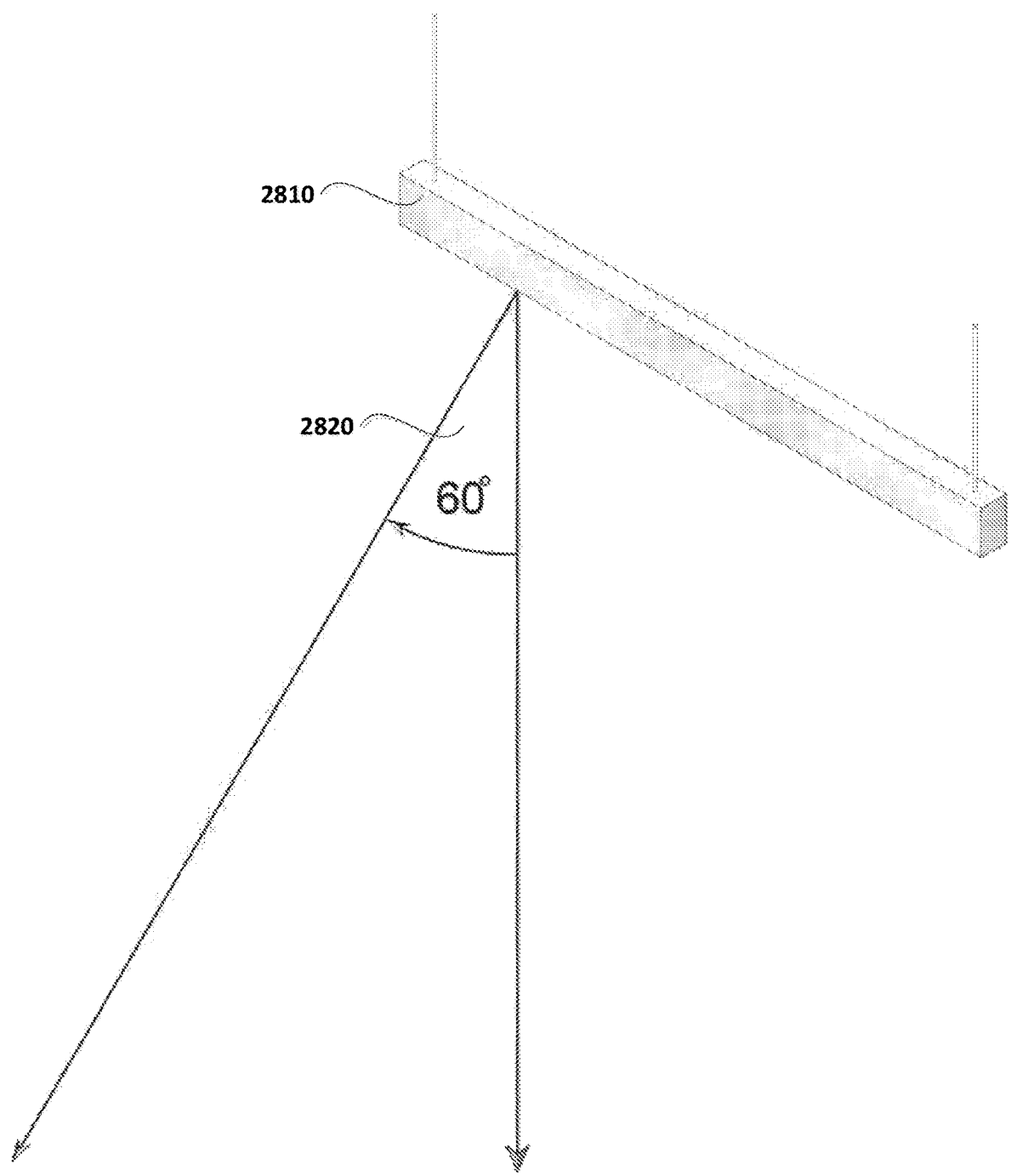
FIG. 28 illustrates an example artificial light source with a beam angle of 60 degrees.

In the example of FIG. 28, the source of light is an artificial light source 2810. In this example, the light source is known to have a spread 2820 of 60 degrees, based on the information about the light source provided by the manufacturer. As above, any spread or beam angle can be modelled.

Figure 29A:
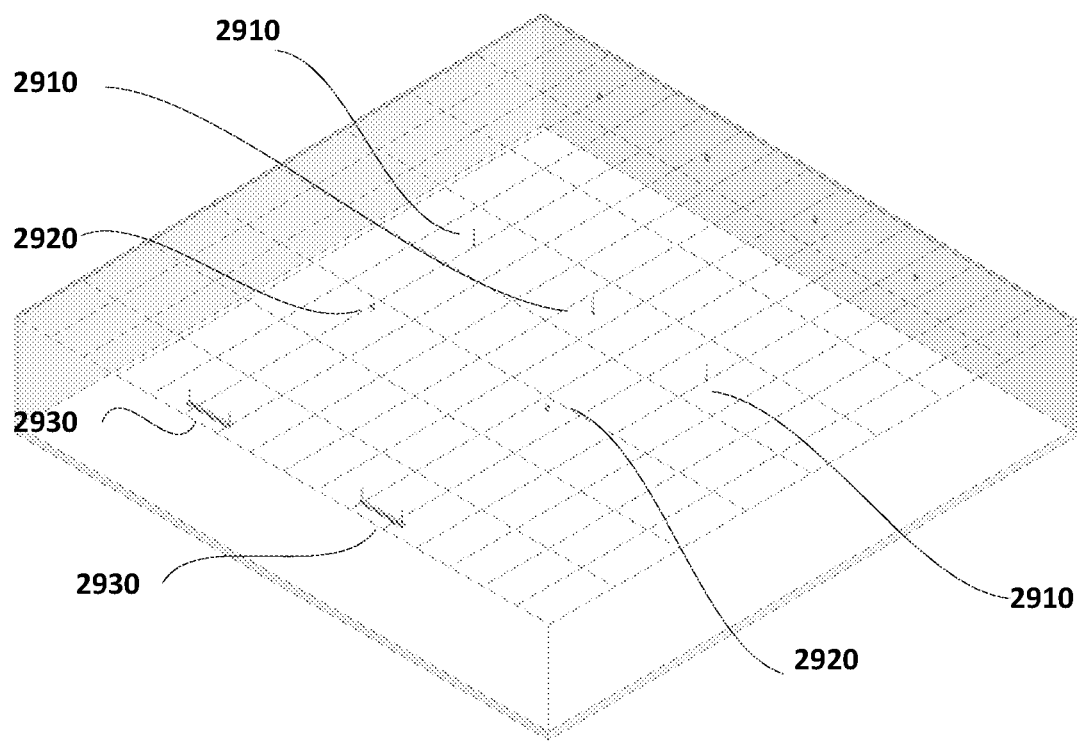
FIG. 29a illustrates an example arrangement of artificial light sources.
Figure 29B:
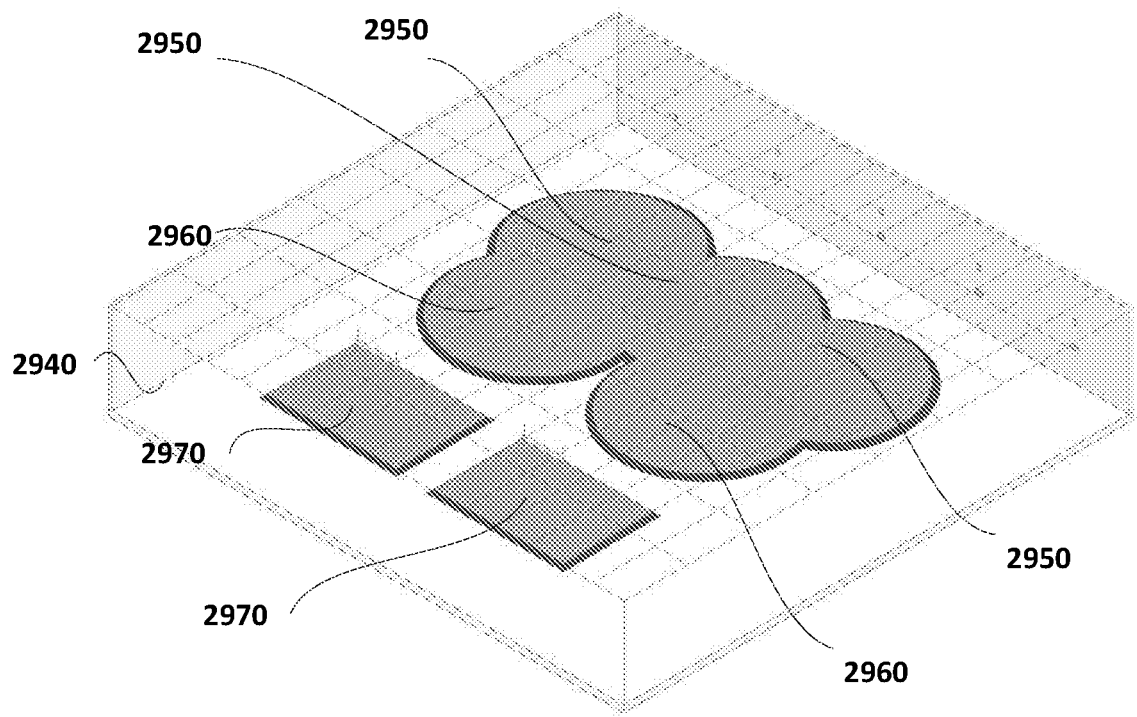

The example of FIG. 29*a* illustrates multiple sources of light. The sources of light are artificial light sources that are estimated to be placed at a ceiling height above the floor. FIG. 29*b* shows the resultant region of light formed by the combination of all the light sources. As can be seen, the light sources 2930 produce a rectangular shape region of light 2970 when intersected with a specified plane 2940. The light sources 2910 and 2920 produce circular shapes of light 2950, 2960 when intersected with the specified plane 2940.

The sources of light can be artificial, natural or a combination of both. This example could be further expanded by adding in additional tables and chairs or other light attenuating objects within the specified area in order to determine a three dimensional region of light that takes into account such furnishings. A three dimensional region determined with this method may be useful for optimising an internal layout in order to maximise the amount of sun for specific furnishings like couches, chairs, or indoor gardens or optimising a layout in order to minimise sunlight or artificial light for furnishings like televisions, computer screens or other objects that function best without light reflections. In addition, some objects can be placed in a position to both maximise sunlight at certain times and minimise sunlight at other times. For example, internal gardens with herbs or flowers that require morning sun but not afternoon sun.

It should be noted that the intensity of light may decrease based on the distance from an artificial light source. Consequently, much like the method of determining a three dimensional region of visibility graded by distance 2000 above, a grading of light from artificial light sources may be determined and indicated on the display.

Figure 30:
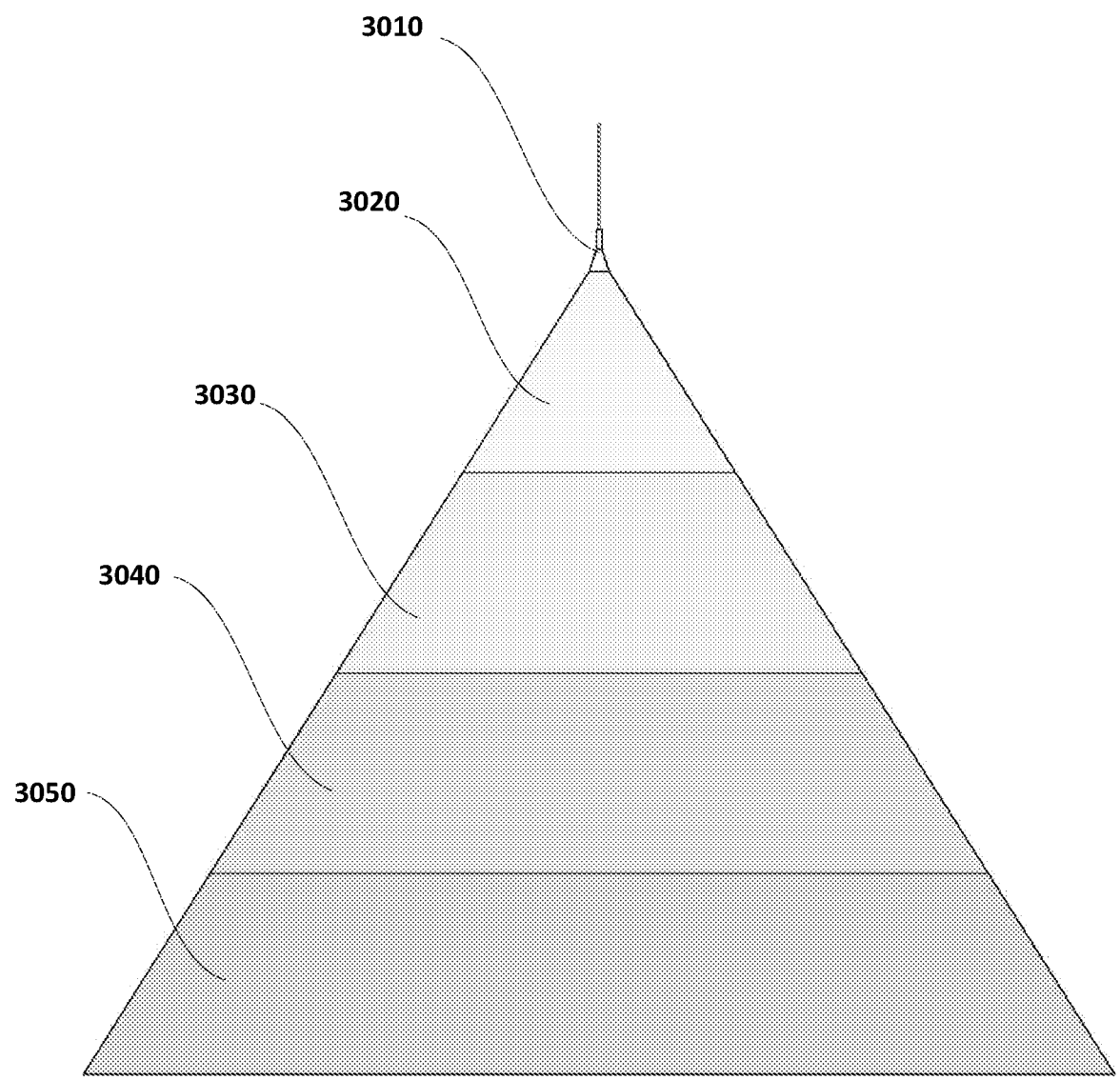
FIG. 30 illustrates a two dimensional side view of a three dimensional region of light graded by distance from the light source.

FIG. 30 is an example illustration of a three dimensional region of light graded by distance from the light source 3010. In this example, the three dimensional region of light is illustrated from the side in a two dimensional view. The three dimensional region is split into interval regions of light starting from the light source 3010 In this case the interval regions of light are calculated at 50 centimetre metres intervals as measured in a straight line from the light source 3010. The interval region of light 3020 is up to 50 centimetres from the light source, the interval region of light 3030 starts at 50 centimetres and ends at 100 centimetres from the light source. The interval region of light 3040 begins at 100 centimetres from the light source and ends at 150 centimetres from the light source. In this example the final interval region of light 3050 starts at 150 centimetres from the light source and ends at 200 centimetres from the light source. Each of the gradings represent a different intensity of light, as light further from a light source is less intense the further away it is from the viewing location. In this example, the gradings are linearly spaced apart, however, it is to be appreciated that gradings could be spaced in other ways such as logarithmic. A logarithmic spacing of the gradings for example, may be more accurate in modelling the drop off in intensity from the light source. Furthermore, in this example, interval regions of light are represented by gradings that are linearly displaced along an axis from the light source 3010. Interval regions of light could also be represented as in regions defined by arcuate boundaries that are radially displaced at specified distance(s) from the light source 3010.

Positions of the Sources of Light

As indicated in some of the examples, it is possible to use the same method to determine a three dimensional region of light in the specified area where there are multiple sources of light or multiple positions of the same source of light. For example, the sun moves over the course of a day and the direction of the sunlight that is received by the specified area changes over the course of the day. It is possible therefore to determine the three dimensional region of light based on a first position of a source of light at a first time and a second position of the source of light at a second time. For example, there could be a region of light determined for morning sun and afternoon sun. Each of these regions can be aggregated to form a combined three dimensional region of light.

It may be possible when determining one or more light attenuating objects to determine one or more translucent objects such as windows, door openings and skylights. That is, because the geometry of the translucent windows, door openings and skylights can be identified, the geometry of the walls of the specified area that attenuate light can be calculated by simply geometric subtraction. When determining the geometry of the windows it is preferable to determine both the geometry of the external window and the internal window. The depth of the window can substantially affect the three dimensional region of light that is ultimately determined. The more accurate the three dimensional region of light that is determined, the more accurately it replicates the light that actually would be received in the specified area.

Location Information

Location information may be as simple as determining orientation of the specified area. Location information may also include aspects about the location such as the building in which the apartment is built or to be built. Location information may also involve determining the context of the specified area such as any relevant buildings, structures or other light attenuating objects that may affect the region of light calculation. If the specified area is in an location where the context is known or ascertainable, the data relating to the context may be retrieved from known data sources such as government agencies, local councils, developers, builders and architects who work in the location or who otherwise have data relating to the location.

Example System

Figure 31:
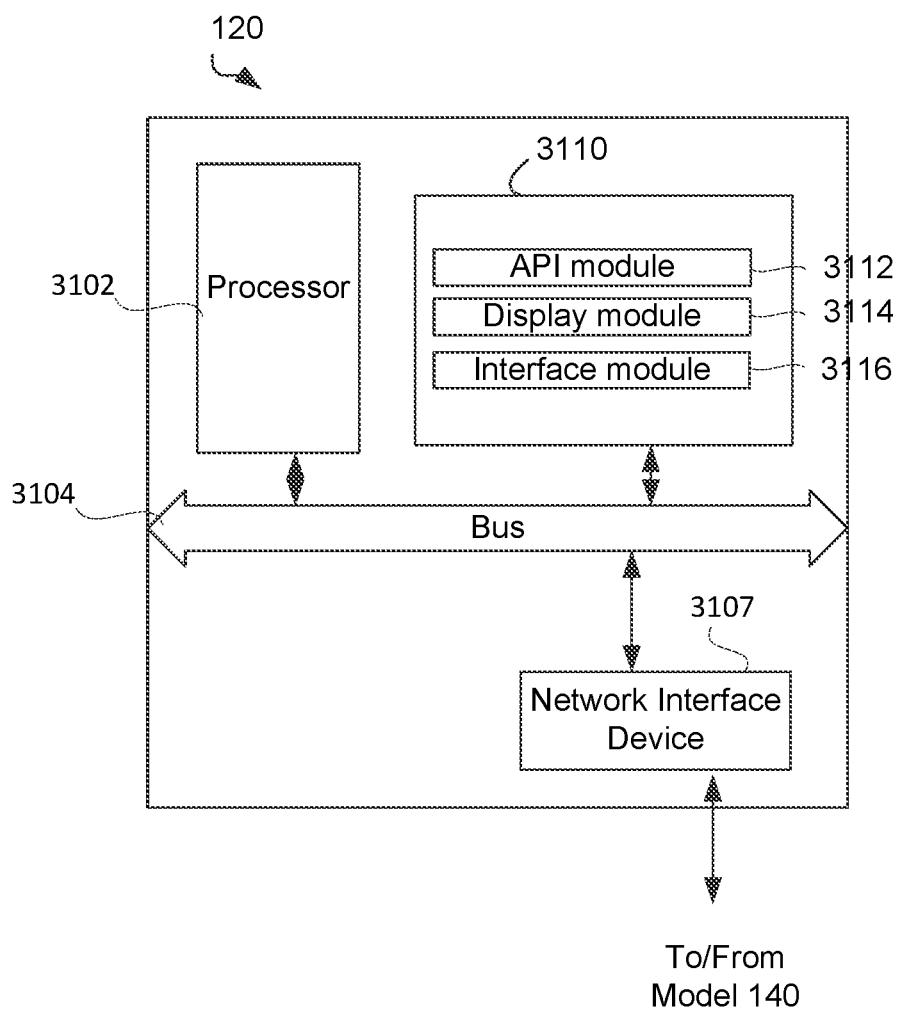
FIG. 31 illustrates an example server.

The server 120 shown in FIG. 31 includes a processor 3102, a memory 3110, and a network interface device 3107 that communicate with each other via a bus 3104. The memory stores instructions 3112, 3114, and 3116 and data for the processes described with reference to FIGS. 2 to 30, and the processor performs the instructions from the memory to implement the processes.

The processor 3102 performs the instructions stored on memory 3110. Processor 3102 receives an input by a user 110. Processor 3102 determines an instruction according to the API module 3112. The instruction may be a function to execute according to the method to determine a three dimensional region of light. The processor 3102 may execute instructions stored in the interface module 3116 to communicate with the model 140. The processor 3102 may execute instructions stored in the display module 3114 to show the three dimensional region of light on the display 130.

It will be appreciated by persons skilled in the art that numerous variations and/or modifications may be made to the above-described embodiments, without departing from the broad general scope of the present disclosure. The present embodiments are, therefore, to be considered in all respects as illustrative and not restrictive.

The invention claimed is:

1. A computer implemented method for determining a three dimensional region of light in a specified area that receives light from one or more sources of light comprising:
   determining location information of the specified area;
   estimating one or more positions of the respective one or more sources of light;
   determining one or more light attenuating objects; and
   determining a three dimensional region of light in the specified area that receives light from the one or more sources of light based on:
      location information of the specified area,
      the one or more positions of the one or more sources of light, and
      the one or more light attenuating objects in a path of light between the one or more sources of light and the specified area,
   wherein the three dimensional region of light has a defined non-zero volume.

2. A computer implemented method according to claim 1, wherein the step of determining a three dimensional region of light in the specified area is based on a first position of a source of light at a first time and a second position of the source of light at a second time.

3. A computer implemented method according to claim 1, wherein the three dimensional region of light is determined using forward projection of the path of light from the one or more positions of the one or more sources of light to the specified area.

4. A computer implemented method according to claim 1, wherein determining a three dimensional region of light in the specified area comprises determining a first set of light attenuating objects and determining an approximate region of light based on the first set of light attenuating objects.

5. A computer implemented method according to claim 4, wherein determining the three dimensional region of light in the specified area comprises determining a second set of light attenuating objects and determining a refined three dimensional region of light based on the first and second sets of light attenuating objects.

6. A computer implemented method according to claim 5, wherein determining a refined three dimensional region comprises determining surrounding context that includes one or more of the second set of light attenuating objects.

7. A computer implemented method according to claim 5, wherein the approximate region of light and the refined region of light are determined by forward projection of the path of light from the one or more positions of the one or more sources of light to the specified area.

8. A computer implemented method according to claim 6, wherein determining a refined three dimensional region of light comprises determining a region of shadow in the specified area.

9. A computer implemented method according to claim 8, wherein determining a refined three dimensional region of light comprises subtracting a region of shadow in the specified area from the approximate region of light in the specified area.

10. A computer implemented method according to claim 1, further comprising determining one or more specified three dimensional regions in the specified area and determining one or more sub-parts of the one or more specified three dimensional regions that intersect the three dimensional region of light.

11. A computer implemented method according to claim 1, further comprising determining one or more specified planes extending through the specified area that intersects the three dimensional region of light.

12. A computer implemented method according to claim 11, further comprising calculating a proportion of a first specified plane that intersects the three dimensional region of light in the specified area.

13. A computer implemented method according to claim 12, further comprising calculating a proportion of the first specified plane that is formed by the three dimensional region of light at multiple respective positions of the one or more sources of light at multiple respective times.

14. A computer implemented method according to claim 12, further comprising calculating a proportion of a second specified plane extending through the specified area that intersects the three dimensional region of light.

15. A computer implemented method according to claim 1, further comprising determining a grading of the three dimensional region of light according to the distance from a light source.

16. A computer implemented method according to claim 15, further comprising determining a grading of the three dimensional region of light according to multiple positions of the one or more source of light.

17. A computer implemented method according to claim 1, further comprising determining a ranking of specified areas based on the proportion of the specified area that is formed by the three dimensional region of light.

18. A computer implemented method according to claim 11, further comprising determining a ranking of specified areas based on the proportion of one or more specified planes extending through a specified area that intersect the three dimensional region of light.

19. A computer implemented method according to claim 1, further comprising determining the specified area from a two dimensional floor plan by constructing a three dimensional model of the specified area from the two dimensional floor plan.

20. A computer system for determining a three dimensional region of light in an specified area that receives light from one or more sources of light comprising:

a processor:
- to determine location information of the specified area;
- to estimate one or more positions of the one or more sources of light;
- to determine one or more light attenuating objects; and
- to determine a three dimensional region of light in the specified area that receives light from the one or more sources of light based on:
  - location information of the specified area,
  - the one or more positions of the one or more sources of light, and
  - the one or more light attenuating objects in a path of light between the one or more sources of light and the specified area, wherein the three dimensional region of light has a defined non-zero volume.

* * * * *